(12) United States Patent
Tseng et al.

(10) Patent No.: US 11,174,157 B2
(45) Date of Patent: Nov. 16, 2021

(54) SEMICONDUCTOR DEVICE PACKAGES AND METHODS OF MANUFACTURING THE SAME

(71) Applicant: Advanced Semiconductor Engineering, Inc., Kaohsiung (TW)

(72) Inventors: Chi Sheng Tseng, Kaohsiung (TW); Lu-Ming Lai, Kaohsiung (TW); Yu-Hsuan Tsai, Kaohsiung (TW); Yin-Hao Chen, Kaohsiung (TW); Hsin Lin Wu, Kaohsiung (TW); San-Kuei Yu, Kaohsiung (TW)

(73) Assignee: ADVANCED SEMICONDUCTOR ENGINEERING INC., Kaohsiung (TW)

( * ) Notice: Subject to any disclaimer, the term of this patent is extended or adjusted under 35 U.S.C. 154(b) by 0 days.

(21) Appl. No.: 16/452,370

(22) Filed: Jun. 25, 2019

(65) Prior Publication Data

US 2020/0002162 A1 Jan. 2, 2020

Related U.S. Application Data

(60) Provisional application No. 62/690,877, filed on Jun. 27, 2018.

(51) Int. Cl.
*B81C 1/00* (2006.01)
*H01L 23/498* (2006.01)
(Continued)

(52) U.S. Cl.
CPC ........ *B81C 1/00269* (2013.01); *B81B 7/0006* (2013.01); *H01L 23/49827* (2013.01); *H01L 24/16* (2013.01); *H01L 24/48* (2013.01); *H01L 24/73* (2013.01); *H01L 24/92* (2013.01); *B81B 2207/07* (2013.01); *B81B 2207/095* (2013.01); *B81C 2203/035* (2013.01); *H01L 2224/16225* (2013.01); *H01L 2224/16235* (2013.01); *H01L 2224/32225* (2013.01);
(Continued)

(58) Field of Classification Search
CPC ............ B81C 1/00269; B81B 2207/07; B81B 2207/095
See application file for complete search history.

(56) References Cited

U.S. PATENT DOCUMENTS 6,373,130 B1 * 4/2002 Salaville ................. H01L 23/10
257/692
6,396,082 B1 * 5/2002 Fukasawa ............. H01L 33/486
257/79

(Continued)

FOREIGN PATENT DOCUMENTS

DE 102009028037 A1 * 2/2011 ............. H01L 23/50

OTHER PUBLICATIONS

Machine translation, Reinmuth, German Pat. Pub. No. DE 102009028037A1, translation date: Dec. 31, 2020, Espacenet, all pages. (Year: 2020).*

*Primary Examiner* — Victoria K. Hall
(74) *Attorney, Agent, or Firm* — Foley & Lardner LLP

(57) ABSTRACT

A semiconductor device package includes a semiconductor device, a non-semiconductor substrate over the semiconductor device, and a first connection element extending from the semiconductor device to the non-semiconductor substrate and electrically connecting the semiconductor device to the non-semiconductor substrate.

16 Claims, 25 Drawing Sheets

(51) Int. Cl.
  *H01L 23/00* (2006.01)
  *B81B 7/00* (2006.01)
(52) U.S. Cl.
  CPC .............. *H01L 2224/48225* (2013.01); *H01L 2224/48235* (2013.01); *H01L 2224/9201* (2013.01)

(56) References Cited

U.S. PATENT DOCUMENTS

| | | | | |
|---|---|---|---|---|
| 7,078,737 | B2* | 7/2006 | Yuri | H01L 33/505 257/99 |
| 7,368,808 | B2* | 5/2008 | Heck | B81C 1/00269 257/678 |
| 7,622,751 | B2* | 11/2009 | Ishihara | H01L 33/60 257/99 |
| 8,154,115 | B1* | 4/2012 | Chan | B81B 7/007 257/704 |
| 9,133,021 | B2* | 9/2015 | Chang | H01L 29/84 |
| 10,290,613 | B2* | 5/2019 | Uzoh | H01L 24/11 |
| 10,996,125 | B2* | 5/2021 | Eckinger | B81C 3/001 |
| 2004/0041159 | A1* | 3/2004 | Yuri | H01L 24/24 257/79 |
| 2005/0067688 | A1* | 3/2005 | Humpston | H01L 24/48 257/704 |
| 2005/0262929 | A1* | 12/2005 | Felton | B81C 1/0023 73/104 |
| 2006/0175707 | A1* | 8/2006 | Lee | H01L 23/04 257/767 |
| 2006/0211233 | A1* | 9/2006 | Gan | B81C 1/00301 438/613 |
| 2006/0261364 | A1* | 11/2006 | Suehiro | C03C 27/06 257/100 |
| 2006/0286798 | A1* | 12/2006 | Lee | B81C 1/00301 438/672 |
| 2007/0085195 | A1* | 4/2007 | Lee | H01L 21/4817 257/704 |
| 2007/0138644 | A1* | 6/2007 | McWilliams | H03H 9/1092 257/774 |
| 2007/0145564 | A1* | 6/2007 | Honer | H03H 9/1092 257/690 |
| 2007/0164410 | A1* | 7/2007 | Kim | B81C 1/00301 257/678 |
| 2008/0001241 | A1* | 1/2008 | Tuckerman | H01L 31/0203 257/434 |
| 2008/0029780 | A1* | 2/2008 | Ohtsuka | H01L 33/56 257/99 |
| 2009/0098731 | A1* | 4/2009 | Gan | H01L 24/11 438/667 |
| 2009/0218668 | A1* | 9/2009 | Zhe | H01L 24/11 257/680 |
| 2009/0224273 | A1* | 9/2009 | Sakamoto | H01L 33/483 257/98 |
| 2010/0019393 | A1* | 1/2010 | Hsieh | B81C 1/0023 257/777 |
| 2010/0052082 | A1* | 3/2010 | Lee | B81B 7/0061 257/416 |
| 2010/0072562 | A1* | 3/2010 | Sato | H01L 23/04 257/415 |
| 2010/0155865 | A1* | 6/2010 | Sugiura | B81C 1/00301 257/417 |
| 2010/0176466 | A1* | 7/2010 | Fujii | B81B 7/02 257/415 |
| 2011/0012248 | A1* | 1/2011 | Reichenbach | B81C 1/00301 257/680 |
| 2011/0147859 | A1* | 6/2011 | Tanaka | H01L 21/768 257/415 |
| 2011/0175179 | A1* | 7/2011 | Chiu | H01L 21/56 257/418 |
| 2011/0227174 | A1* | 9/2011 | Fujii | B81B 7/0006 257/415 |
| 2012/0080702 | A1* | 4/2012 | Lin | H01L 33/62 257/98 |
| 2012/0126348 | A1* | 5/2012 | Horning | B81B 7/0041 257/417 |
| 2012/0142144 | A1* | 6/2012 | Taheri | B81B 7/007 438/107 |
| 2012/0217645 | A1* | 8/2012 | Pagaila | H01L 24/83 257/774 |
| 2013/0050155 | A1* | 2/2013 | Petersen | B81B 7/0067 345/204 |
| 2013/0050226 | A1* | 2/2013 | Shenoy | B81B 7/007 345/501 |
| 2013/0193527 | A1* | 8/2013 | Chu | B81B 7/007 257/414 |
| 2013/0341738 | A1* | 12/2013 | Reinmuth | B81B 7/007 257/415 |
| 2014/0202838 | A1* | 7/2014 | Sano | H01H 59/0009 200/181 |
| 2014/0231995 | A1* | 8/2014 | Ando | B81C 1/00301 257/741 |
| 2014/0361387 | A1* | 12/2014 | Meyer | B81C 1/00333 257/415 |
| 2015/0033878 | A1* | 2/2015 | Brida | B32B 38/08 73/862.637 |
| 2015/0069618 | A1* | 3/2015 | Gudeman | H01L 21/486 257/774 |
| 2015/0311175 | A1* | 10/2015 | Ho | H01L 24/02 257/777 |
| 2015/0353348 | A1* | 12/2015 | Vandemeer | B81C 1/00269 257/415 |
| 2016/0016789 | A1* | 1/2016 | Yu | B81C 1/00293 257/417 |
| 2016/0172402 | A1* | 6/2016 | Katkar | H01L 27/1469 257/292 |
| 2016/0176706 | A1* | 6/2016 | Monadgemi | B81B 7/0006 438/51 |
| 2016/0221824 | A1* | 8/2016 | Alper | H01L 23/10 |
| 2016/0229685 | A1* | 8/2016 | Boysel | B81B 7/007 |
| 2016/0244325 | A1* | 8/2016 | Cheng | B81B 7/02 |
| 2016/0297674 | A1* | 10/2016 | Man | B81B 7/007 |
| 2016/0379936 | A1* | 12/2016 | Spitzlsperger | H01L 29/41708 257/139 |
| 2017/0320726 | A1* | 11/2017 | Leitgeb | H04R 19/04 |
| 2018/0013055 | A1* | 1/2018 | Metzger | B81B 7/02 |
| 2018/0024159 | A1* | 1/2018 | Takahata | G01P 15/0802 257/48 |
| 2018/0127265 | A1* | 5/2018 | Brioschi | B81B 7/0006 |
| 2018/0127268 | A1* | 5/2018 | Fukumitsu | H03H 3/0072 |
| 2018/0159017 | A1 | 6/2018 | Mills | |
| 2018/0297834 | A1* | 10/2018 | Renaud-Bezot | B81B 7/0067 |
| 2018/0297838 | A1* | 10/2018 | Kautzsch | B81B 7/02 |
| 2018/0352339 | A1* | 12/2018 | Piechocinski | B81B 3/0086 |
| 2019/0062151 | A1* | 2/2019 | Cheng | B81C 1/00269 |
| 2019/0084826 | A1* | 3/2019 | Singh | B81C 1/00301 |
| 2019/0127215 | A1* | 5/2019 | Hirata | B81C 1/00301 |
| 2019/0144269 | A1* | 5/2019 | Rajasekaran | B81B 7/0077 257/704 |
| 2019/0161346 | A1* | 5/2019 | Lee | B81C 1/00293 |

* cited by examiner

SEMICONDUCTOR DEVICE PACKAGES AND METHODS OF MANUFACTURING THE SAME

1. CROSS REFERENCE TO RELATED APPLICATIONS

This application claims the benefit of and priority to U.S. provisional application No. 62/690,877, filed Jun. 27, 2018, the contents of which are incorporated herein by reference in their entirety.

2. TECHNICAL FIELD

The present disclosure relates to a semiconductor package structure associated with a Microelectromechanical Systems (MEMS).

3. DESCRIPTION OF THE RELATED ART

A MEMS device may include a microprocessor and several components that interact with the surroundings such as microsensors, micromirrors, oscillators, resonators, RF switches, Surface Acoustic Wave (SAW) filters, Bulk Acoustic Wave (BAW) filters, and so forth. A MEMS device package may include a MEMS device bonded with, mounted to or combined with a cap, a carrier, or a substrate. However, there may be certain reliability, cost or pollution concerns related to assembling the MEMS device to the cap, carrier or substrate.

SUMMARY

In some embodiments, the present disclosure provides a semiconductor device package structure including a semiconductor device, a non-semiconductor substrate over the semiconductor device, and a first connection element extending from the semiconductor device to the non-semiconductor substrate and electrically connecting the semiconductor device to the non-semiconductor substrate.

In some embodiments, the present disclosure provides a method for manufacturing a semiconductor package structure, the method including (1) providing a semiconductor wafer having a plurality of device regions, each of the device regions having a micro-electrical-mechanical component, (2) forming a patterned insulation layer over the semiconductor wafer, surrounding the micro-electrical-mechanical component in each of the device regions; and (3) bonding a patterned substrate to the semiconductor wafer and spaced by the patterned insulation layer.

BRIEF DESCRIPTION OF THE DRAWINGS

Aspects of the present disclosure are readily understood from the following detailed description when read with the accompanying figures. It should be noted that various features may not be drawn to scale. In fact, the dimensions of the various features may be arbitrarily increased or reduced for clarity of discussion.

DETAILED DESCRIPTION

Figure 1A:
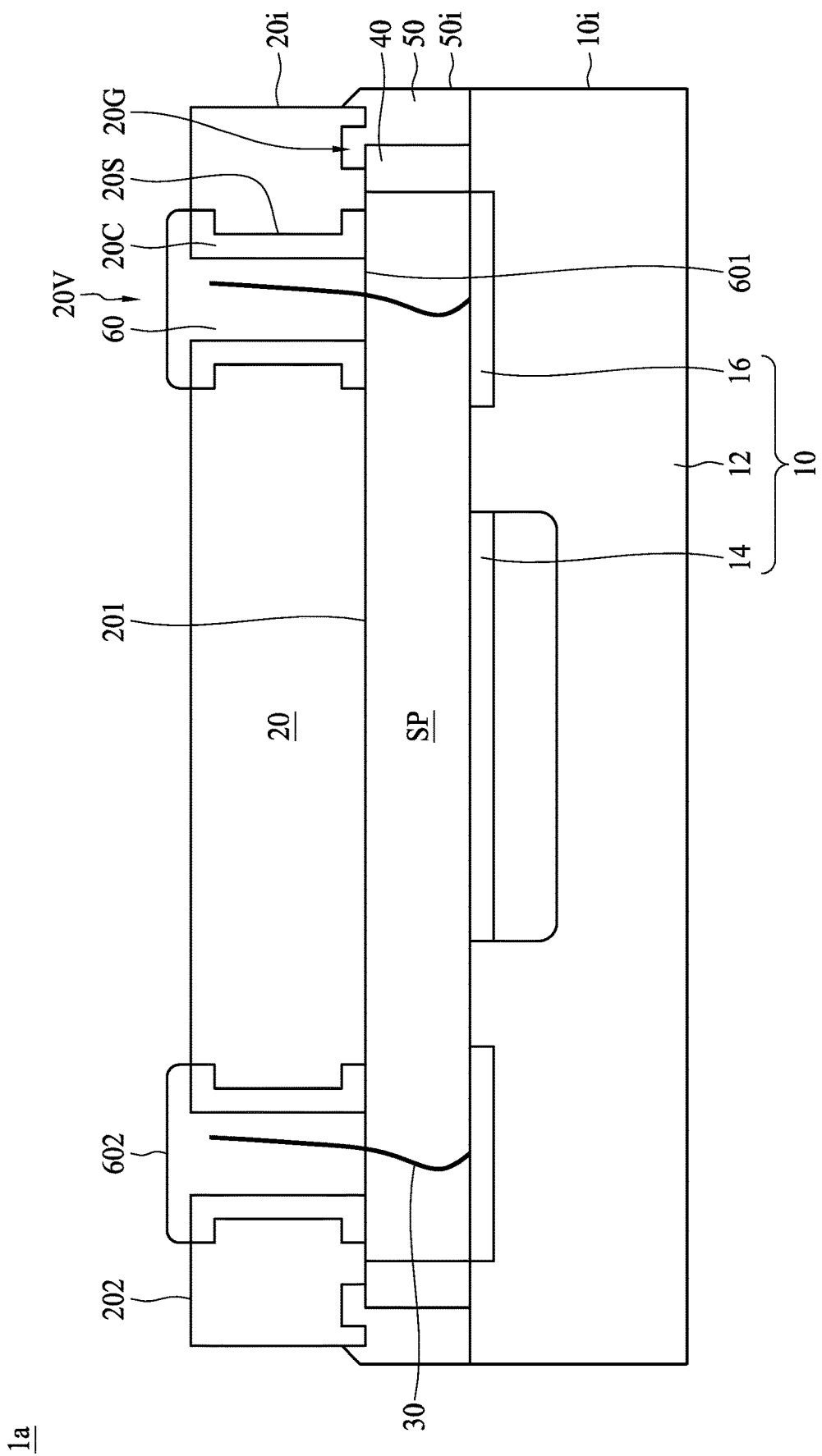
FIG. 1A shows a cross-sectional view of a semiconductor device package in accordance with some embodiments of the subject application.

Common reference numerals are used throughout the drawings and the detailed description to indicate the same or similar components. Embodiments of the present disclosure will be readily understood from the following detailed description taken in conjunction with the accompanying drawings.

Spatial descriptions, such as "above," "below," "up," "left," "right," "down," "top," "bottom," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

Among the radio frequency (RF) device in wireless communication, a filter is used to remove signal with specified frequency range, and effectively avoid noise interference. Bulk Acoustic Wave (BAW) filter is adopted by high-grade portable smart device over surface acoustic wave (SAW) filter due to stringent performance criterion. To pursue higher efficacy in high grade portable smart device with frequency greater than 2.5 GHz, BAW filters, or a MEMS component, will be selected over SAW.

Silicon cap substrate is typically used to package a filter structure. Silicon cap substrate is fabricated with TSV structure as an electrical connection means between package I/O and chip I/O. However, package structure having TSVs lead to higher manufacturing cost. For example, silicon cap substrate is disposed over semiconductor device including MEMS components such as various membranes. Silicon cap substrate may include a plurality of TSVs which electrically connected with the underlying semiconductor device. In addition to greater manufacturing cost, flux and/or solder material used in a soldering operation may further contaminate the membrane on the semiconductor device. Nevertheless, water cleaning may not be adopted to remove the flux and/or solder contaminating the membrane since water may further deteriorate the performance of the membrane.

Present disclosure provides a semiconductor device package including a semiconductor device, a patterned insulation layer on the semiconductor device, and a substrate over the patterned insulation layer. The patterned insulation layer controls the leveling of the substrate, and a first connection element, for example, a metal wire or a conductive bump, is extending from the semiconductor device to the substrate in order to form electrical connection between package I/O and chip I/O. The substrate can be patterned to possess through holes or stamp holes.

Referring to FIG. 1A, a semiconductor device package 1a includes a semiconductor device 10, a substrate 20 over the semiconductor device 10, connection elements 30 electrically coupling the semiconductor device 10 and the substrate 20, a patterned insulation layer 40 spaced between the semiconductor device 10 and the substrate 20, an adhesive layer 50 bonding the semiconductor device 10 and the substrate 20, and connection elements 60 at the substrate 20.

The semiconductor device 10 includes a semiconductor substrate 12, a MEMS component such as a membrane 14, and a patterned conductive layer 16 such as patterned conductive pads on a surface of the semiconductor device 10 facing the substrate 20 and surrounding the MEMS component.

The semiconductor device 10 may include but is not limited to a microsensor die, a micromirror die, an oscillator die, a resonator die, an RF switch die, a Surface Acoustic Wave (SAW) filter die, a Bulk Acoustic Wave (BAW) filter die or the like.

In some embodiments, the substrate 20 is a non-semiconductor substrate such as an organic substrate composed of polymer resin, epoxy resin, imide resin, or the like, plastic, or thermosetting plastic. The fabrication of the organic substrates can be accomplished by existing printed circuit board (PCB) fabrication technique. The method includes heat pressing a plurality of insulating core boards or injection molding to form organic substrate. In some embodiments, the substrate 20 is a non-semiconductor substrate such as a ceramic substrate, a dielectric substrate, or a glass substrate.

The substrate 12 may include but is not limited to piezoelectric material (e.g. quartz, lithium niobate ($LiNbO_3$ or LNB), lithium tantalate ($LiTaO_3$ or LTA), semiconductor material, dielectric material, glass, or other suitable materials. In some embodiments, the substrate 12 includes materials different from the substrate 20.

The substrate 20 is disposed on the semiconductor device 10. The substrate 20 is attached or bonded to the semiconductor device 10 by the adhesive layer 50. The substrate 20 has at least a through hole 20V filled with conductive material, or a conductive via hole. The substrate 20 includes a patterned conductive layer 20C in the through hole 20V or conductive via hole. As shown in FIG. 1A, the patterned conductive layer 20C is disposed on a sidewall 20S of the through hole 20V or conductive via hole. The sidewall 20S of the substrate 20 defines a through hole penetrating the non-semiconductor substrate 20.

In some embodiments, the substrate 20 defines a space, groove or recess 20G. The space 20G may function as an adhesion strengthener to receive the adhesive material of the adhesive layer 50. The space 20G may be filled with the adhesive material of the adhesive layer 50. Although it is not illustrated in FIG. 1A, it is contemplated that the space 20G may be partially filled with the adhesive material of the adhesive layer 50, and a portion of the space 20G is not filled by any material(s).

The substrate 20 may include a circuitry (not illustrated in FIG. 1A). The substrate 20 may include a redistribution layer (RDL) structure (not illustrated in FIG. 1A). The non-semiconductor substrate 20 may include a solder mask (SM) structure (not illustrated in FIG. 1A). The substrate 20 may include conductive pad(s), trace(s), and interconnection(s) (e.g. via(s)). The substrate 20 may include ceramic, dielectric material, glass or other suitable materials. The patterned conductive layer 20C includes metal (e.g. copper (Cu), aluminum (Al), Au, Ag, etc.), alloy, or other suitable conductive materials.

The insulation layer 40 is disposed on the semiconductor device 10. The insulation layer 40 is disposed between the semiconductor device 10 and the non-semiconductor substrate 20. The insulation layer 40 may include dielectric material, a photo sensitive material (e.g. a photoresist (PR) material). The insulation layer 40 may improve a tilt control for the assembly of the substrate 20 and the semiconductor device 10. As shown in FIG. 1A, the insulation layer 40 may be patterned to surround a periphery of the patterned conductive layer 16.

The adhesive layer 50 is disposed on the semiconductor device 10. The adhesive layer 50 is disposed between the semiconductor device 10 and the non-semiconductor substrate 20. The adhesive layer 50 surrounds the insulation layer 40 from a side distant from the patterned conductive layer 16. The adhesive layer 50 fills the space 20G of the non-semiconductor substrate 20. In some embodiments, when volume of adhesive layer 50 is abundant, the adhesive layer 50 fills the entire space 20G of the substrate 20 and optionally, a top surface of the adhesive layer 50 may be situated closer to a top surface 202 than a bottom surface 201 of the non-semiconductor substrate 20. In some embodiments, when volume of the adhesive layer 50 is less than abundant, the adhesive layer 50 fills part of the space 20G of the non-semiconductor substrate 20, and optionally, a top surface of the adhesive layer 50 may be situated closer to a bottom surface 201 than a top surface 202 of the non-semiconductor substrate 20. The adhesive layer 50 supports the substrate 20 over the semiconductor device 10. As shown in FIG. 1A, a width of the substrate 20 is narrower than a width of the semiconductor device 10.

As shown in FIG. 1A, the adhesive layer 50 laterally covers or surrounds the insulation layer 40. The adhesive layer 50 has a side surface or lateral surface 50i coplanar with a side surface or lateral surface 10i of the semiconductor device 10. The adhesive layer 50 has a side surface or lateral surface 50i which is not coplanar with a surface 20i of the non-semiconductor substrate 20. The adhesive layer 50 may include an adhesive or bonding material.

The connection element 30 extends from the semiconductor device 10 into the through hole 20V of the non-semiconductor substrate 20. The connection element 30 extends from the semiconductor device 10 into the connection element 60 of the non-semiconductor substrate 20. In some embodiments, the connection element 30 is surrounded by the connection element 60. In some embodiments, the connection element 30 is partially exposed by the connection element 60 and forms an electrical connection with the connection element 60. In some embodiments, the connection element 30 is lower than the surface 202 of the substrate 20. The connection element 30 extends from the patterned conductive layer 16 of the semiconductor device 10 into the through hole 20V of the non-semiconductor substrate 20. The connection element 30 electrically connects the semiconductor device 10 to the non-semiconductor substrate 20. The connection element 30 is electrically connected to the patterned conductive layer 16. The connection element 30 may include, for example but is not limited to, a conductive pillar, a conductive pin, or a conductive wire. The connection element 30 includes metal (e.g. copper (Cu), aluminum (Al), Au, Ag, etc.), alloy, or other suitable conductive material(s).

In some embodiments, the connection element 60 is disposed within the through hole 20V of the non-semiconductor substrate 20. In some embodiments, the connection element 60 is disposed on a portion of the patterned conductive layer 20C over the top surface of the non-semiconductor substrate 20. In some embodiments, the connection element 60 is surrounded by the portion of the patterned conductive layer 20C at the inner sidewall fan-out the through hole 20V. The connection element 60 fills or seals the through hole 20V and forms a cavity between the semiconductor device 10, the insulation layer 40, and the non-semiconductor substrate 20. Although it is not illustrated, it is contemplated that the connection element 60 fills a portion (e.g., an upper portion) of the through hole 20V and leaves another portion (e.g., a lower portion) of the through hole 20V unfilled in accordance with some other embodiments of the subject application. As illustrated in FIG. 1A, a surface 602 of the connection element 60 is higher than, or protruding form, a surface 202 of the substrate 20. A surface 602 of the connection element 60 is not coplanar with a surface 202 of the substrate 20. Although it is not illustrated in FIG. 1A, it is contemplated that a lower portion of the through hole 20V is not filled by the connection element 60 in accordance with some other embodiments of the subject application.

A bottom surface 601 of the connection element 60 may be coplanar with a bottom surface 201 of the substrate 20. Although it is not illustrated in FIG. 1A, it is contemplated that a bottom surface 601 of the connection element 60 may be higher than a bottom surface 201 of the substrate 20 in accordance with some other embodiments of the subject application. The connection element 60 surrounds and is in contact with the connection element 30. The connection element 60 electrically connects the connection element 30 to the patterned conductive layer 20C of the non-semiconductor substrate 20. A space SP is defined between the semiconductor device 10 and the substrate 20. The connection element 60 may function as an I/O pad for electrical connection of the semiconductor device package 1a. The connection element 60 may include, for example but is not limited to, a solder material.

In some embodiments, the semiconductor device package 1a that uses a non-semiconductor substrate 20 and the connection elements 30, 60 to replace a semiconductor substrate (e.g., silicon capping substrate with through silicon vias (TSVs)) is cost effective. A MEMS component such as a membrane 14 of semiconductor device package 1a is protected from contamination (e.g. water, solder or flux, etc.) during manufacturing process. As shown in FIG. 1A, the insulation layer 40 is patterned to surround the membrane 14.

Figure 1B:
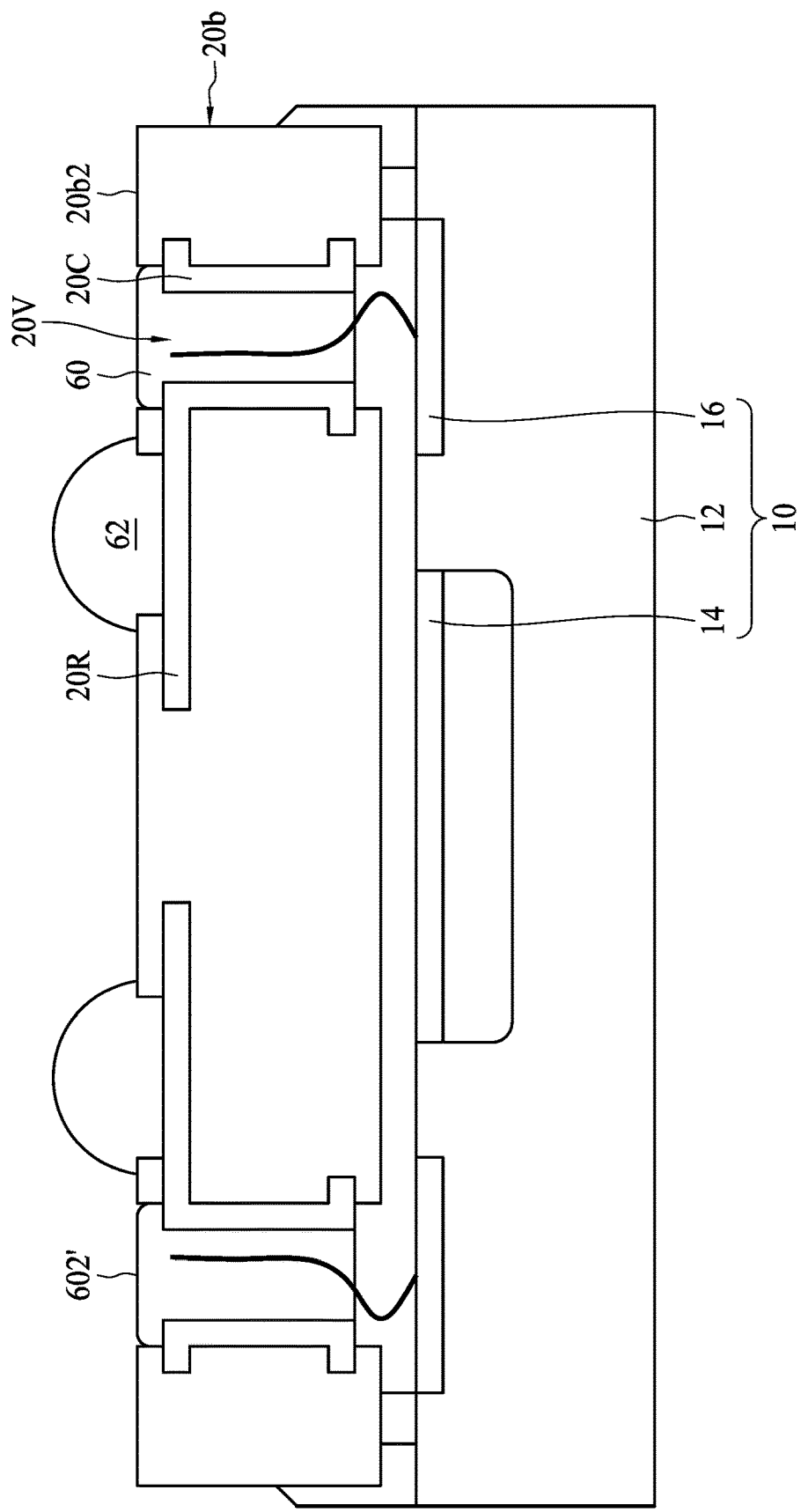
FIG. 1B shows a cross-sectional view of a semiconductor device package in accordance with some embodiments of the subject application.

Referring to FIG. 1B, the semiconductor device package 1b is similar to the semiconductor device package 1a as described and illustrated with reference to FIG. 1A, except that the semiconductor device package 1b further includes a patterned conductive layer in proximity to a top surface 202 of the substrate 20. The patterned conductive layer may include a redistribution layer (RDL) 20R and connection elements 62 electrically coupled to the RDL 20R.

In some embodiments, the RDL 20R may extend from the patterned conductive layer 20C at the sidewall of the through hole 20V. The surface 602' of the connection element 60 may be coplanar with a surface 20b2 of the substrate 20b. Although not illustrated in FIG. 1B, a portion of the RDL 20R may be exposed from the substrate 20b.

The connection element 62 may include, for example but is not limited to a solder paste, a pre-solder structure, a solder ball, a copper post/pillar or other suitable material(s). The connection element 62 is disposed on a portion of the RDL 20R that is exposed from the substrate 20b. The connection element 62 is electrically connected to the connection element 60. The connection element 62 may provide external connection for the semiconductor device package 1b. The connection element 62 may provide a stand-off control or design for the semiconductor device package 1b.

Figure 1C:
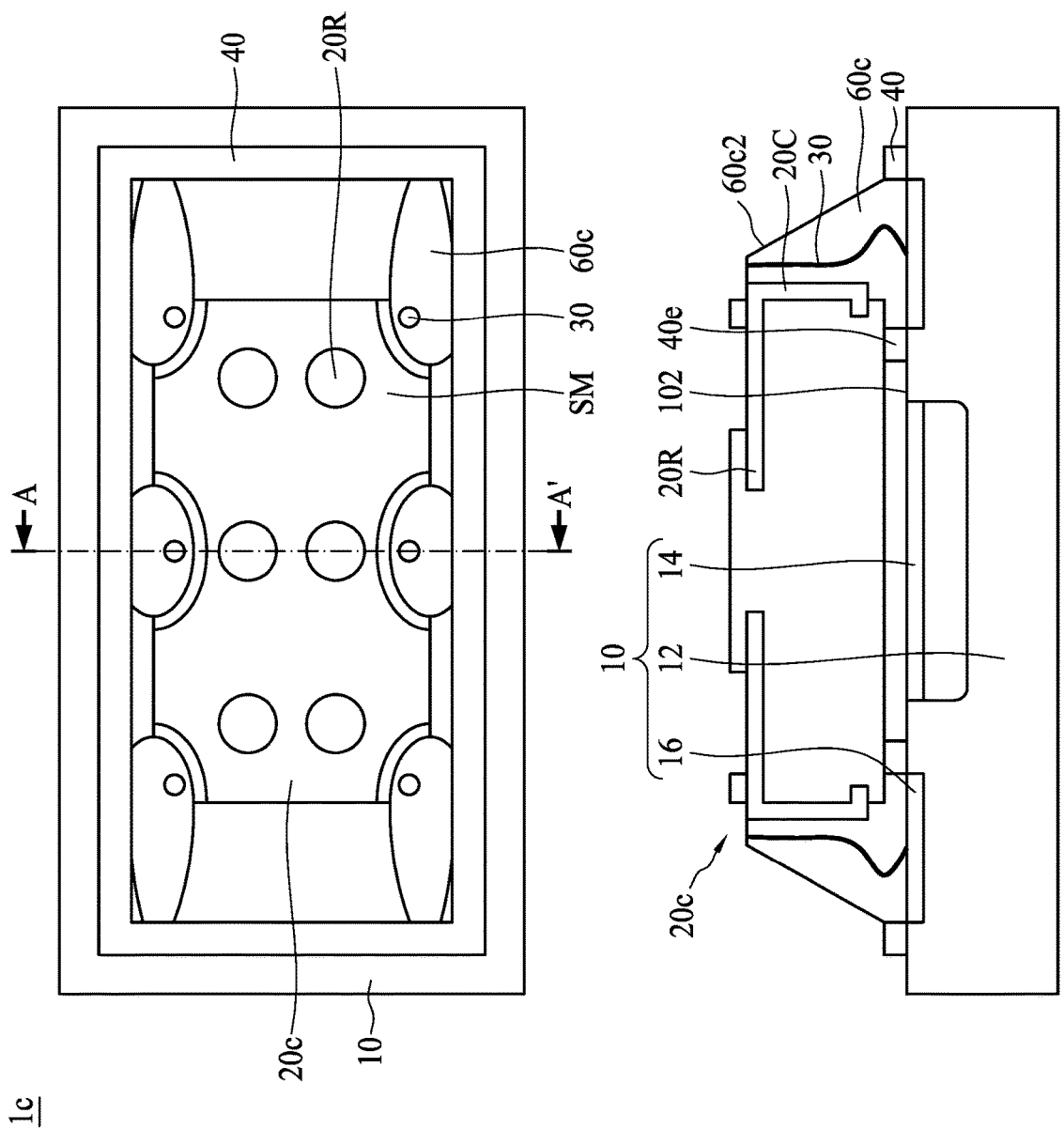
FIG. 1C shows a top view and a cross-sectional view of a semiconductor device package in accordance with some embodiments of the subject application.

Referring to FIG. 1C, the upper portion of FIG. 1C illustrates a top view of a semiconductor device package 1c. The lower portion of FIG. 1C illustrates a cross-sectional view across line AA' in the upper portion of FIG. 1C. The semiconductor device package 1c is similar to the semiconductor device package 1b as described and illustrated with reference to FIG. 1B, except for the following differences. In the semiconductor device package 1c, the substrate 20c has a width smaller than a width of the semiconductor device 10. The through holes 20V in the substrate 20b of the semiconductor device package 1b are replaced by open hole or stamped hole, as shown in FIG. 1C. The patterned insulation layer 40 may be exposed from the substrate 20c. The connection element 60c connects the patterned conductive layer 16 of the semiconductor device 10 to the patterned conductive layer 20C at the open hole or stamped hole of the substrate 20c. The connection element 60c may have a circular/square/oval/irregular shape. The connection element 60c has a surface 60c2 inclined or slanted with respect to the surface 102 of the semiconductor device 10. The surface 60c2 may be exposed from the patterned conductive layer 20C and the substrate 20c. The connection element 60c may be composed of solder material. The connection element 60c may extend from the patterned conductive layer 16 of the semiconductor device 10 to a sidewall of the substrate 20c. Compared to the semiconductor device package 1b of FIG. 1B, the patterned insulation layer 40 of the semiconductor device package 1c includes an additional portion 40e between the patterned conductive layer 16 and the membrane 14. The patterned insulation layer 40 is in contact with the connection element 60c. In some embodiments, the connection element 30 is covered by the connection element 60c. In other embodiments, the connection element 30 may be omitted in the semiconductor device package 1c.

Figure 1D:
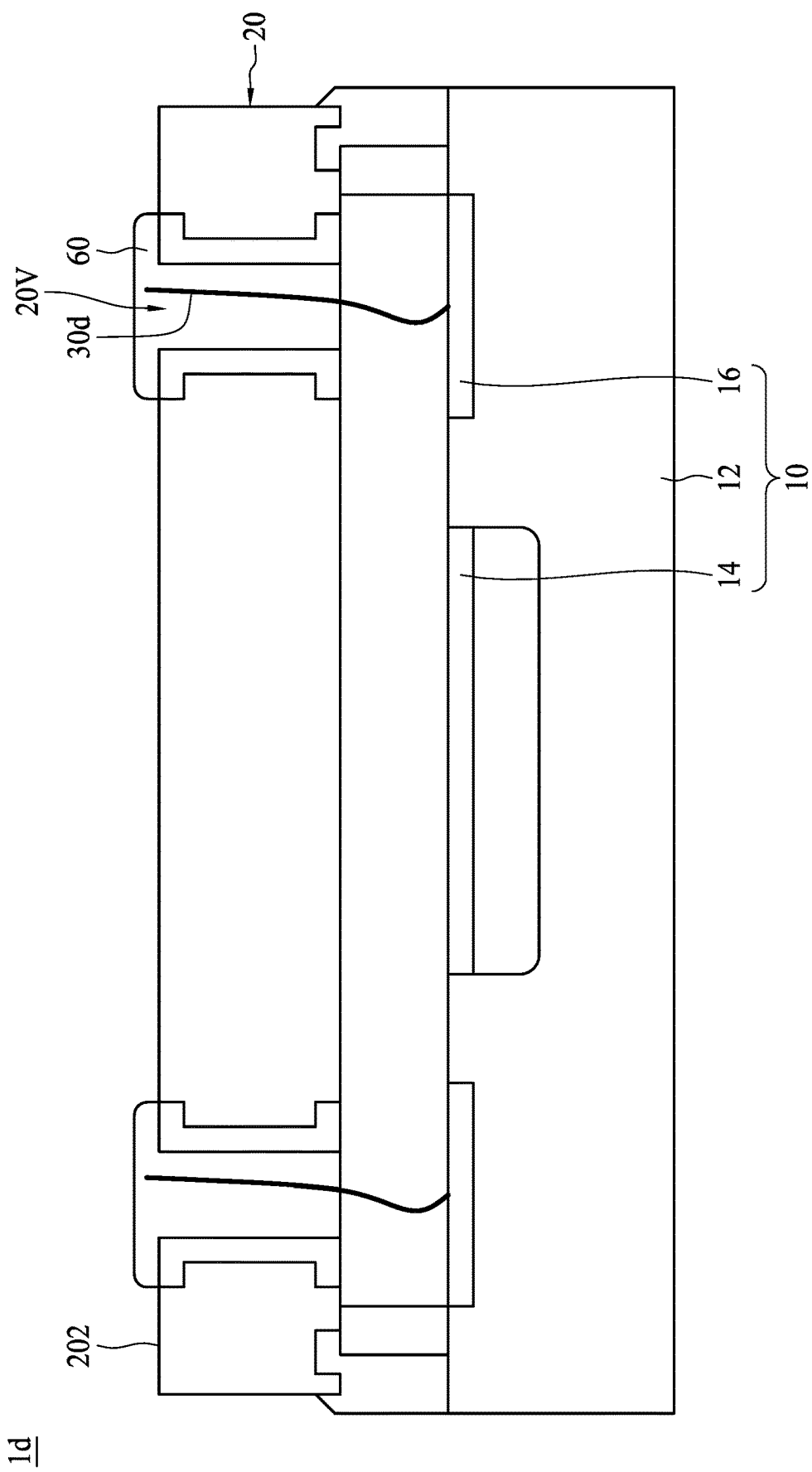
FIG. 1D shows a cross-sectional view of a semiconductor device package in accordance with some embodiments of the subject application.

Referring to FIG. 1D, the semiconductor device package 1d is similar to the semiconductor device package 1a except that the connection element 30d is extending over the through hole 20V of the substrate 20. The connection element 30d is surrounded by the connection element 60. The connection element 30d extends over the top surface 202 of the substrate 20. The connection element 30d extends beyond the top surface 202 of the substrate 20. The connection element 30d is extended beyond the top surface 202 of the substrate 20 to further secure the formation of electrical connection between the connection element 30d and the connection element 60. In other words, the electrical connection between the substrate 20 and the semiconductor device 10 may be established with a broader processing window.

Figure 1E:
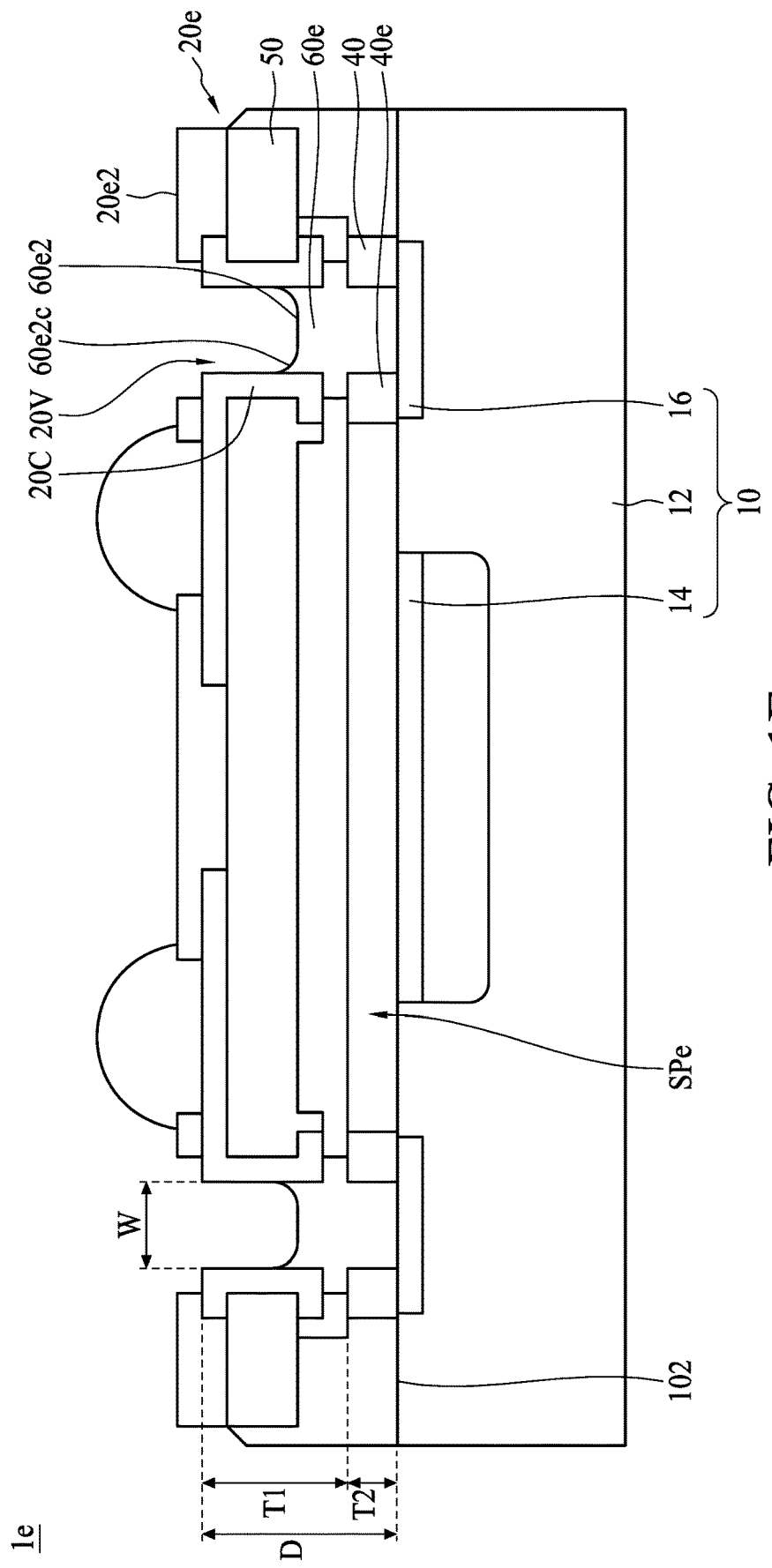
FIG. 1E shows a cross-sectional view of a semiconductor device package in accordance with some embodiments of the subject application.

FIG. 1E shows a semiconductor device package 1e in accordance with some embodiments of the subject application. Although it is not illustrated in FIG. 1E, it is contemplated that the semiconductor device package 1e may include the connection elements 30 in accordance with some other embodiments of the subject application.

The semiconductor device 10 and the substrate 20e are electrically connected by a connection element 60e. The patterned conductive layer 16 of the semiconductor device 10 and the patterned conductive layer 20C of the substrate 20e are electrically connected by a connection element 60e. The connection element 60e is surrounded by the patterned insulation layer 40 similar to that in the semiconductor device package 1c. The connection element 60e is in contact with the patterned insulation layer 40. The connection element 60e is disposed on and in contact with the patterned conductive layer 16. Similar to semiconductor device package 1c, the patterned insulation layer 40 of semiconductor device package 1e has a portion 40e between the membrane 14 and the patterned conductive layer 16 of the semiconductor device 10. The connection element 60e is disposed in a space or cavity defined by the semiconductor device 10, the patterned insulation layer 40 or the patterned insulation layer 40 together with the substrate 20e. The connection element 60e may occupy a portion (e.g., a bottom portion) of the space in the through hole 20V. Although it is not illustrated in FIG. 1E, it is contemplated that the connection element 60e may occupy the entire space or fill up the through hole 20V. A surface 60e2 of the connection element 60e is lower than the surface 20e2 of the substrate 20e. The surface 60e2 has a curve portion 60e2c or has a concave shape. In some other embodiments, the surface 60e2 may be substantially coplanar with a surface 20e2 of the substrate 20e.

The insulation layer 40e may function as a stop wall or a barrier to prevent the connection element 60e from entering a space SPe between the semiconductor device 10 and the substrate 20e during manufacturing operations. Moreover, the membrane 14 is protected from contamination (e.g. from the connection element 60e or flux during manufacturing operation).

The through hole 20V may have a width or a diameter W ranged from about 120 μm to about 150 μm. A distance D between a surface 102 of the semiconductor device 10 and the surface 20e2 of the substrate 20e may be ranged from about 110 μm to about 130 μm. A thickness of the patterned conductive layer 20C may be about 10 μm. A thickness or height T1 of the substrate 20e may be ranged from about 80 μm to about 130 μm. A thickness or height T2 of the patterned insulation layer 40 may be about 30 μm. An aspect ratio (D/W) of the space accommodating connection element 60e indicates a number of solder balls that should be originally disposed in such space before the reflowing operation. In other words, give the solder balls having identical sizes, more solder balls may be placed in the space with higher aspect ratio (D/W) than that with lower aspect ratio (D/W), so long as the connection element 60e forms electrical connection between the patterned conductive layer 16 and the patterned conductive layer 20C after the reflow operation.

Figure 1F:
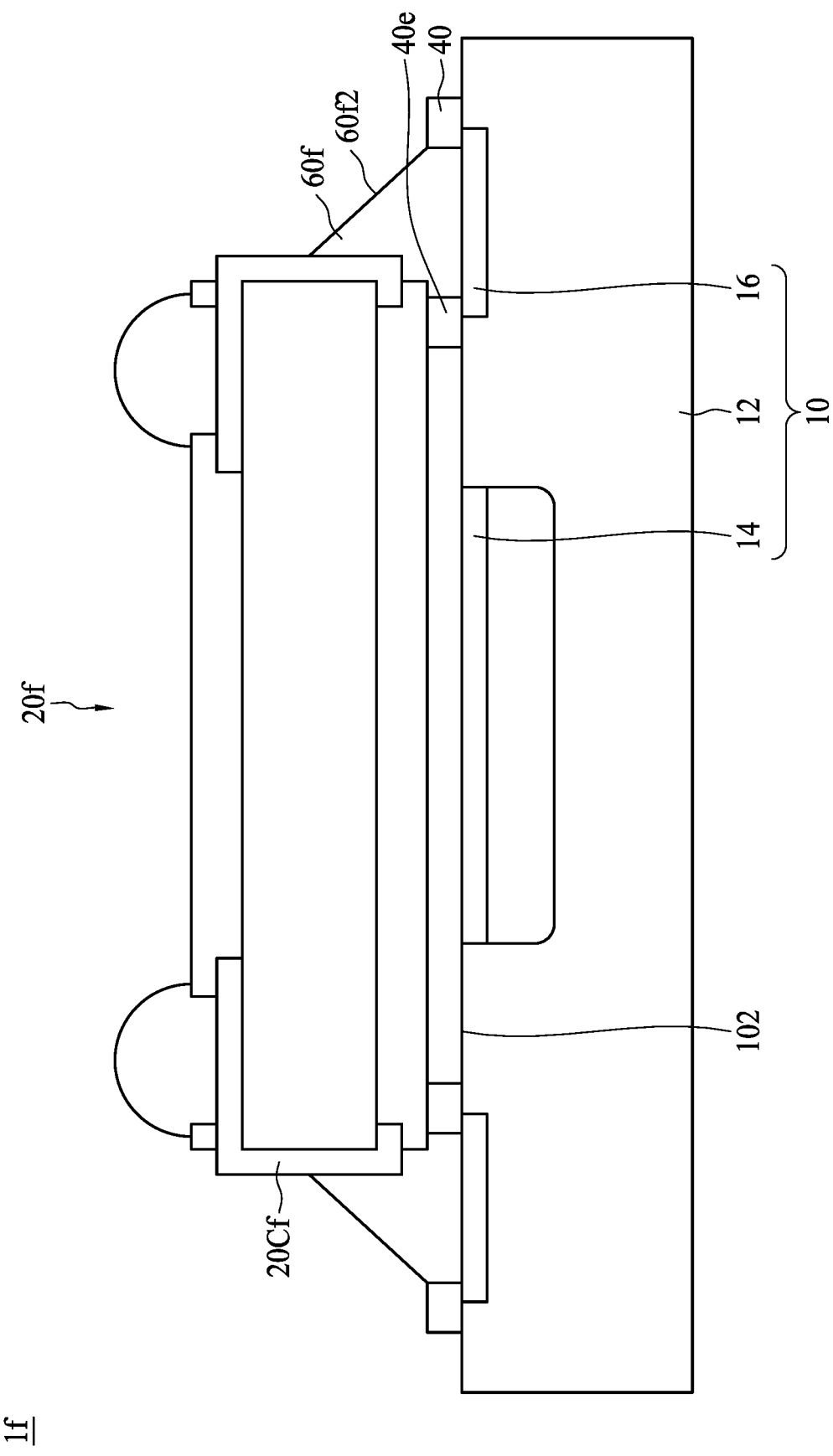
FIG. 1F shows a cross-sectional view of a semiconductor device package in accordance with some embodiments of the subject application.

Referring to FIG. 1F, the semiconductor device package 1f is similar to the semiconductor device package 1e except for the following differences. The semiconductor device package 1f has a substrate 20f. The substrate 20f has a patterned conductive layer 20Cf disposed on sidewalls of the substrate 20f. The patterned conductive layer 20Cf is exposed on sidewalls of the substrate 20f. A connection element 60f electrically connects the semiconductor device 10 to the substrate 20f. A connection element 60f electrically connects the patterned conductive layer 16 of the semiconductor device 10 to the patterned conductive layer 20Cf of the substrate 20f. The connection element 60f has a surface 60f2 inclined or slanted with respect to the surface 102 of the semiconductor device 10. The surface 60f2 extends from the patterned conductive layer 20Cf of the substrate 20f to the insulation layer 40.

Figure 2A:
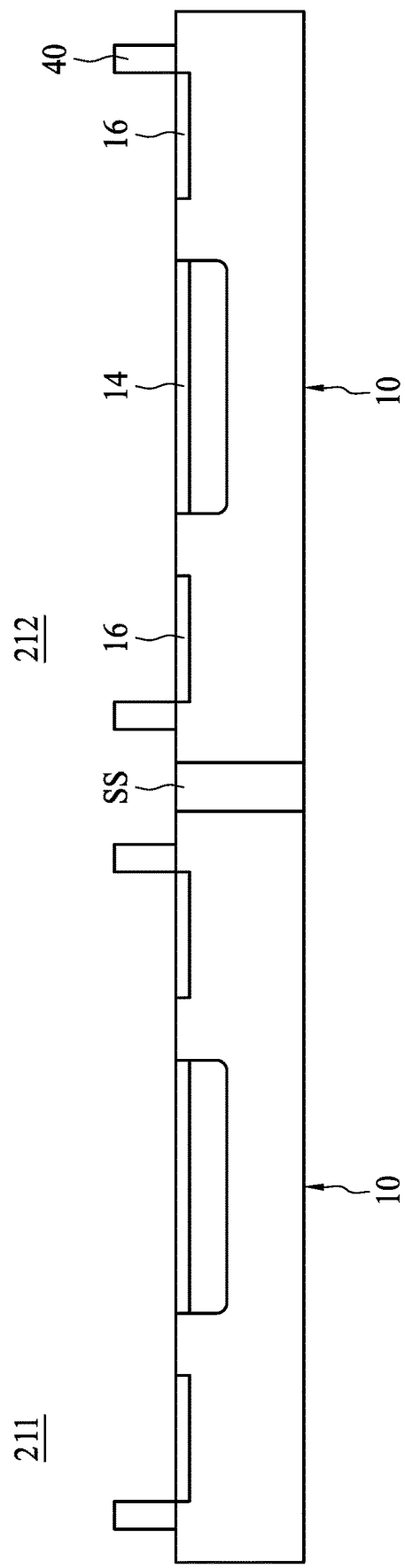
FIG. 2A, FIG. 2B, FIG. 2C, FIG. 2D, FIG. 2E and FIG. 2F show operations of manufacturing a semiconductor device package in accordance with some embodiments of the subject application.

FIG. 2A, FIG. 2B, FIG. 2C, FIG. 2D, FIG. 2E and FIG. 2F show operations of manufacturing a semiconductor device package in accordance with some embodiments of the subject application. Referring to FIG. 2A, semiconductor devices 10 on a wafer level is provided. The semiconductor devices 10 on a wafer level may be referred to a semiconductor wafer herein. The semiconductor wafer includes a plurality of device regions, for example, device region 211 and device region 212 shown in FIG. 2A. Each of the device regions 211, 212 includes at least a MEMS component. As shown in FIG. 2A, the MEMS component include a movable part such as a membrane 14.

A patterned insulation layer 40 is disposed on each semiconductor device 10. The insulation layer 40 may be formed by a lithography operation leaving out a patterned photoresist layer. As shown in FIG. 2A, the patterned insulation layer 40 includes a pattern surrounding the MEMS component as well as the patterned conductive layer 16 in each of the device regions 211, 212. Although FIG. 2A merely shows two device regions 211, 212, it is contemplated that other numbers of device regions can be formed over the semiconductor wafer. Adjacent device regions are connected by a saw street SS at a boundary of the device regions.

Figure 2B:
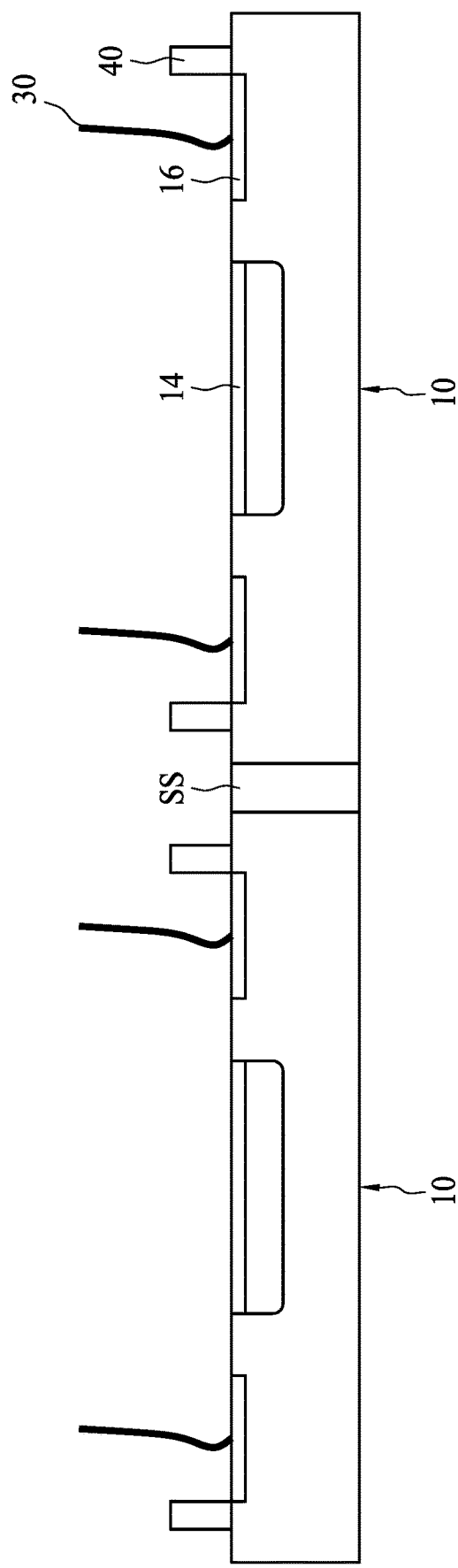

Referring to FIG. 2B, a connection element 30 is formed or bonded on the patterned conductive layer 16 of each of the device regions 211, 212. The connection element 30 may be formed by a wire bonding technique or suitable techniques. As previously discussed, the connection element 30 may be composed of conductive pin or conductive pillar. When a conductive pillar is adopted for the connection element 30, an electroplating operation may be conducted. When a conductive pin is adopted for the connection element 30, a pin planting operation may be performed after the formation of the patterned insulation layer 40.

Figure 2C:
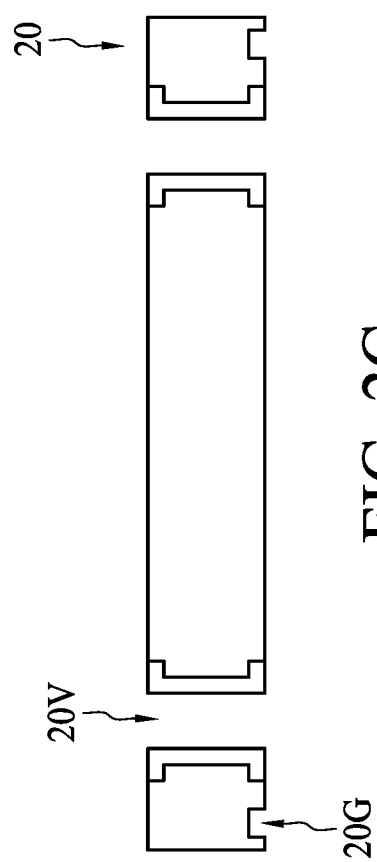

Referring to FIG. 2C, a plurality of substrates 20 is provided. The plurality of substrates 20 can be referred to a patterned substrate herein since at least a through hole 20V is formed in the substrate 20. The substrates 20 may be individually provided over each of the device regions. In addition to through holes 20V, spaces or grooves 20G may also be formed on the patterned substrate 20. In some embodiments, the materials of the substrate 20 may be non-semiconductor materials as previously discussed and can be referred thereto.

Figure 2D:
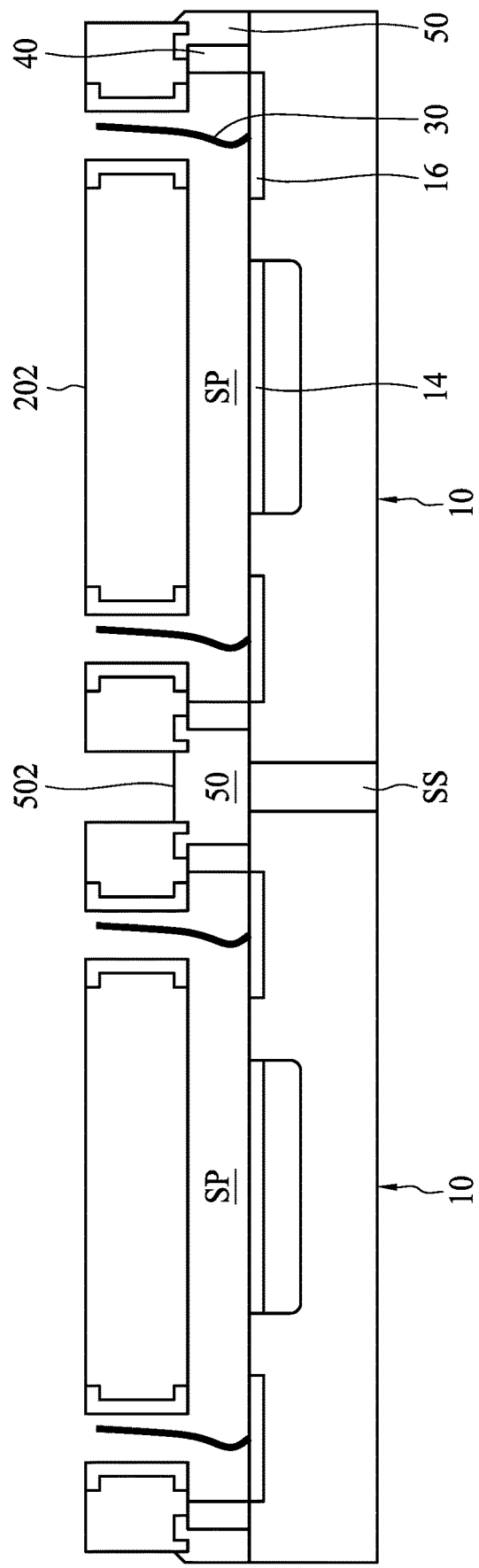

Referring to FIG. 2D, the substrate 20 is bonded to the semiconductor device 10 through the adhesive layer 50, and the substrate 20 is spaced from the underlying semiconductor device 10 by the patterned insulation layer 40 previously formed. The adhesive layer 50 can be formed between adjacent patterned insulation layers 40 before or after the substrate 20 is disposed over the semiconductor device 10. In some embodiments, the adhesive layer 50 can be formed on the scribe line/saw streets SS of the semiconductor wafer or the semiconductor device 10 between adjacent device regions 211, 212. In some embodiments, the adhesive layer 50 can be formed by printing, screening, dispensing or any suitable techniques. In some embodiments, each of the individual substrates 20 is mounted to, attached to, bonded on, assembled with, or combined with a corresponding device region by the adhesive layer 50.

As shown in FIG. 2D, the connection element 30 passes or penetrates through the through hole 20V in the substrate 20, for example, by aligning the through hole 20V with the connection element 30 when bonding the substrate 20 with the semiconductor device 10. A space SP between the semiconductor 10 and the substrate 20 may be defined after the substrate 20 is bonded to the semiconductor device 10. In some embodiments, volume of the adhesive layer 50 may be adjusted such that after combining the substrate 20 with the semiconductor devices 10, a top surface 502 of the adhesive layer 50 may be substantially coplanar with or lower than a top surface 202 of the substrates 20.

Figure 2E:
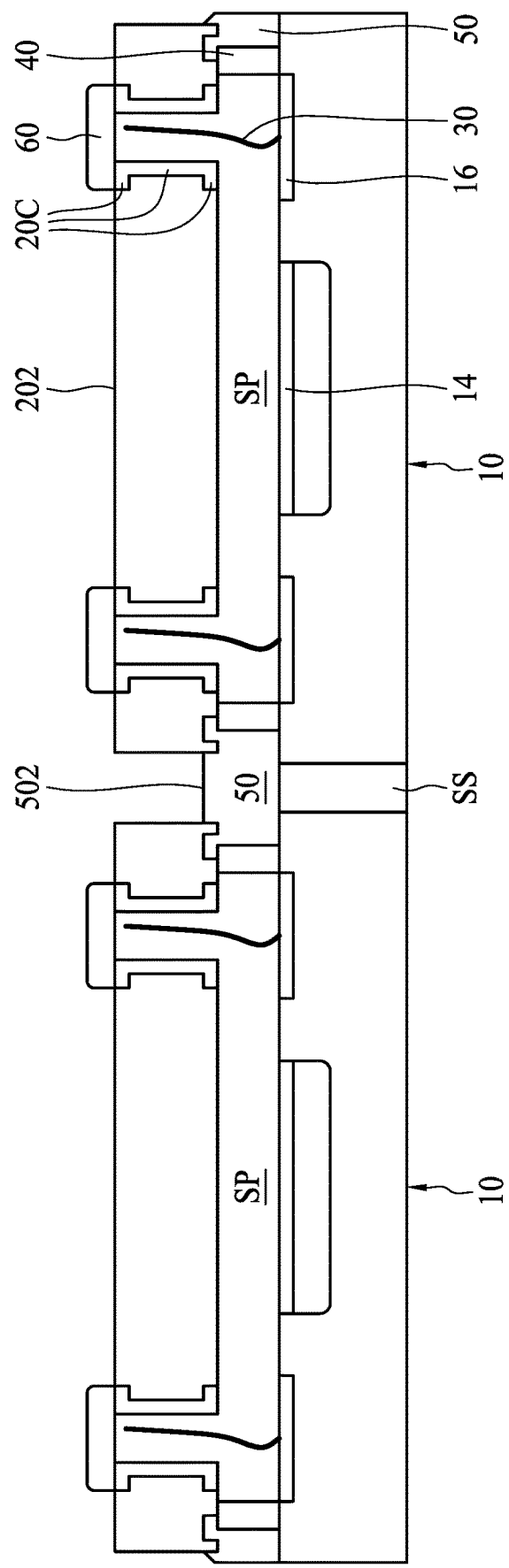

Referring to FIG. 2E, connection elements 60 (e.g. solder pastes or solder materials) are formed over the substrate 20, for example, over a portion of the patterned conductive layer 20C on the top surface 202 of the substrate 20. The connection elements 60 may be formed by printing, screening, dispensing or any suitable techniques.

Figure 2F:
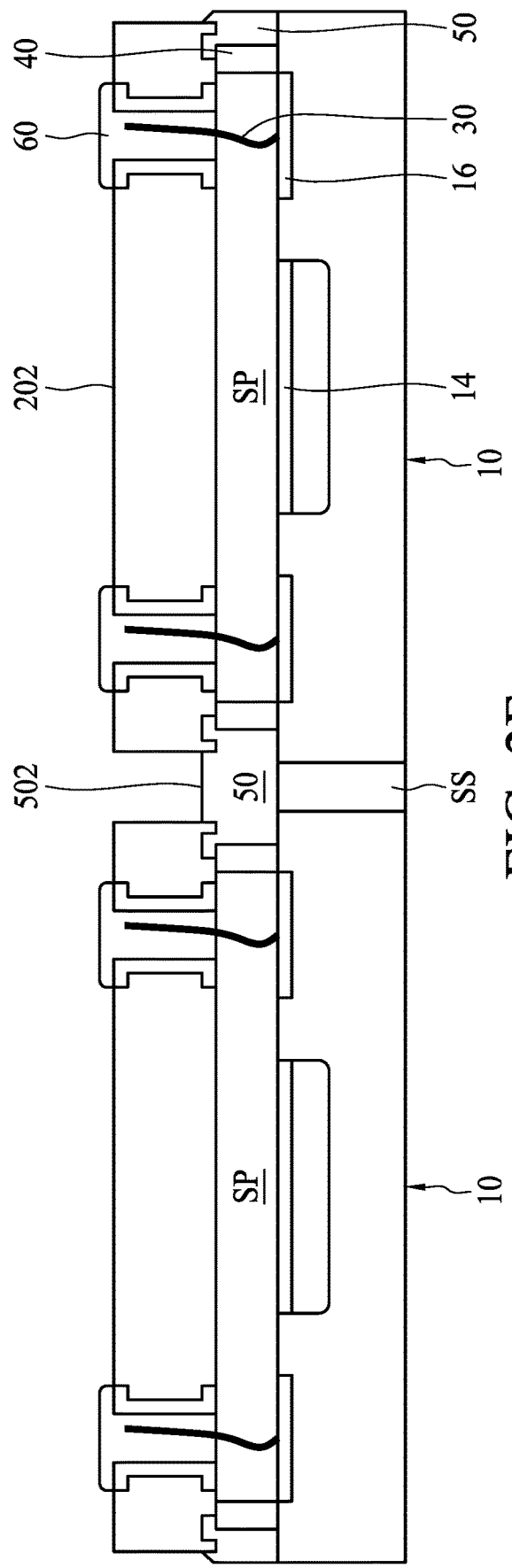

Referring to FIG. 2F, during a reflowing operation, connection elements 60 may be melted and enter into the through hole 20V due to gravity and surface tension and forming an electrical contact with the connection element 30. Depending on the volume of the connection elements 60 (e.g. solder pastes or solder materials) originally disposed over the through hole 20V, connection elements 60 may partially or fully fill the through hole 20V after the reflowing operation. A space SP can be defined by the connection element 60, the substrate 20, the patterned insulation layer 40, and the semiconductor device 10.

Subsequent to FIG. 2F, a singulation operation may be performed along a boundary of adjacent device regions 211, 212, to produce a semiconductor device package similar or same as the semiconductor device package 1a in FIG. 1A.

Figure 3A:
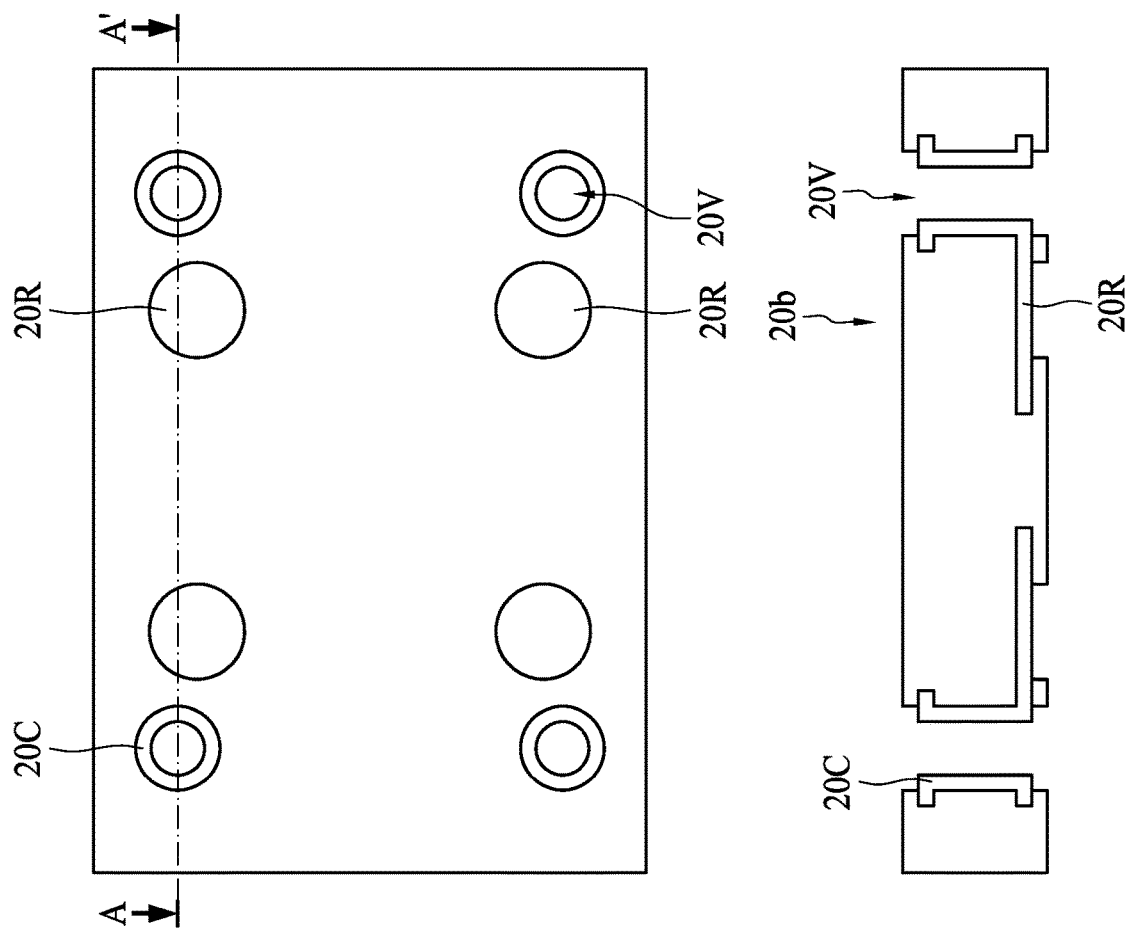
FIG. 3A, FIG. 3B and FIG. 3C show operations of manufacturing a semiconductor device package in accordance with some embodiments of the subject application.
Figure 3B:
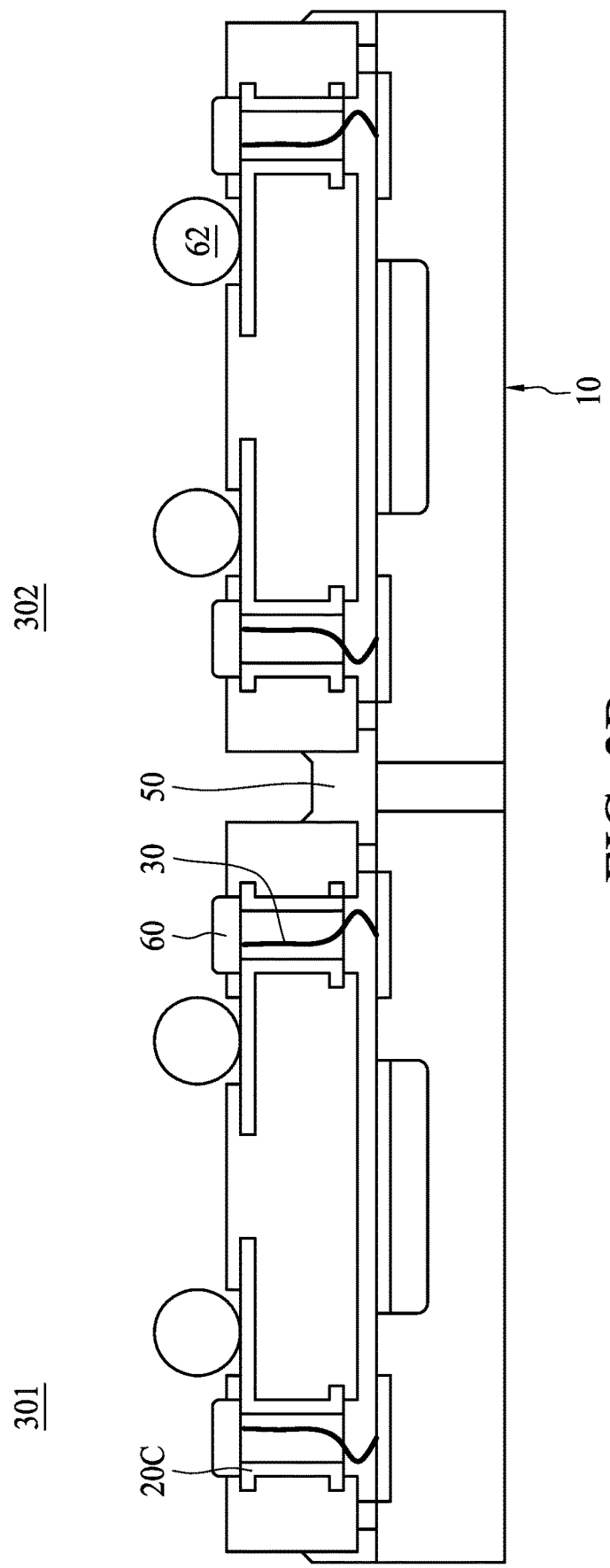
Figure 3C:
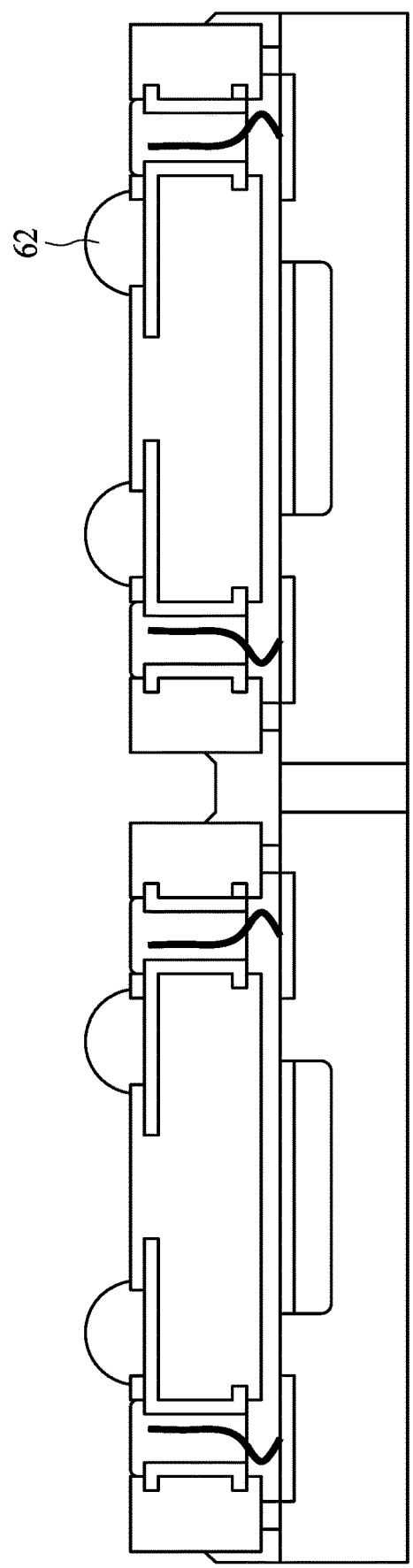

FIG. 3A, FIG. 3B and FIG. 3C show operations of manufacturing a semiconductor device package in accordance with some embodiments of the subject application.

Referring to FIG. 3A and FIG. 3B, a plurality of substrates 20b is provided. The plurality of substrates 20b can be referred to a patterned substrate since at least a through hole 20V is formed in the substrate 20b. The substrates 20b may be individually provided over each of the device regions 301, 302 or combinatorial provided as a strip, a panel, or a matrix over a plurality of device regions 301, 302. In some embodiments, the materials of the substrate 20b may be non-semiconductor materials as previously discussed and can be referred thereto. The upper portion of FIG. 3A illustrates a planar view of the substrate 20b. The lower portion of FIG. 3A illustrates a cross-sectional view of the substrate 20b across line AA' in the upper portion of FIG. 3A. The patterned conductive layer 20C surrounding the through hole 20V of the substrate 20b is further connected to another patterned conductive layer such as an RDL 20R.

A portion of the RDL 20R is exposed from the substrate 20b so that a connection element 62 can be electrically connected to the RDL 20R.

Subsequent to bonding the substrate 20b to the semiconductor device 10 through the adhesion layer 50, as previously described in FIG. 2D, connection elements (e.g. solder balls) 62 are disposed on the exposed portion of the RDL 20R, thereby electrically connected to the substrate 20b. The connection elements 62 may be formed by, for example but is not limited to ball drop technique, printing technique, ball plantation technique or other suitable technique(s).

Referring to FIG. 3C, a reflow operation is performed. The connection elements 62 are melted to form a solder bump on the RDL 20R. The connection element 60 may also melt during the reflow operation and enter into the through hole 20V due to gravity and surface tension, forming an electrical contact with the connection element 30. Depending on the volume of the connection elements 60 (e.g. solder pastes or solder materials) originally disposed over the through hole 20V, connection elements 60 may partially or fully filling the through hole 20V after the reflowing operation.

Subsequent to FIG. 3C, a singulation operation may be performed along a boundary of adjacent device regions 301, 302, to produce a semiconductor device package similar or same as the semiconductor device package 1b shown in FIG. 1B.

FIG. 4A, FIG. 4B, FIG. 4C, FIG. 4D, FIG. 4E, FIG. 4F and FIG. 4G show operations of manufacturing a semiconductor device package in accordance with some embodiments of the subject application.

Figure 4A:
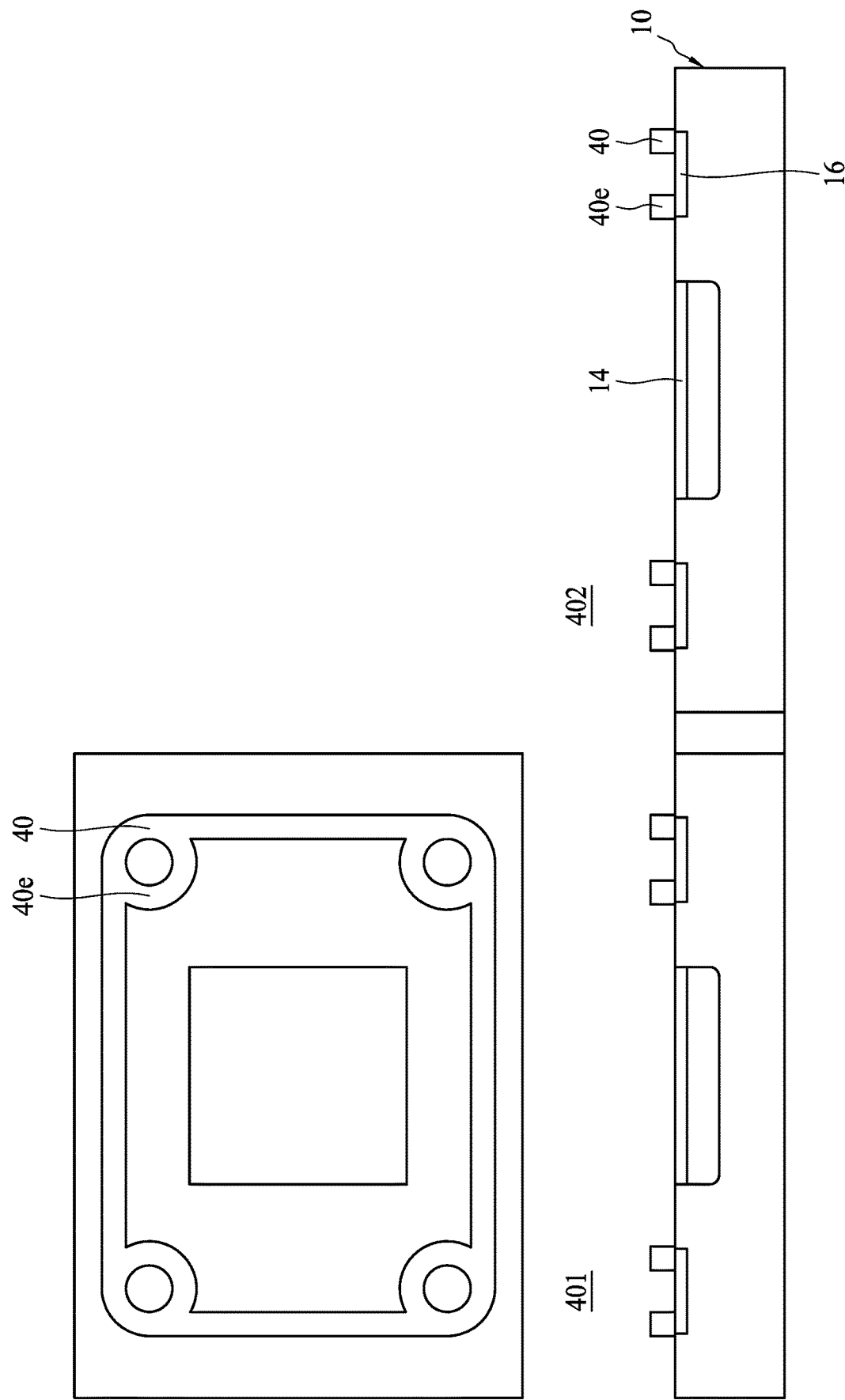
FIG. 4A, FIG. 4B, FIG. 4C, FIG. 4D, FIG. 4E, FIG. 4F and FIG. 4G show operations of manufacturing a semiconductor device package in accordance with some embodiments of the subject application.

Referring to FIG. 4A, a patterned insulation layer 40 is formed in each of the device regions 401, 402 of the semiconductor device 10. In some embodiments, semiconductor devices 10 on a wafer level is provided. The semiconductor devices 10 on a wafer level may be referred to a semiconductor wafer herein. The semiconductor wafer includes a plurality of device regions, for example, device region 401 and device region 402 shown in FIG. 4A. The patterned insulation layer 40 has a portion 40e between the patterned conductive layer 16 and the membrane 14. The upper portion of FIG. 4A shows a planar view of the patterned insulation layer 40. The patterned insulation layer 40 together with the portion 40e surround the patterned conductive layer 16 from its periphery. The patterned insulation layer 40 and the portion 40e form a lateral barrier layer preventing flowable connection element (not shown in FIG. 4A) from contaminating the MEMS components of the semiconductor device 10.

Figure 4B:
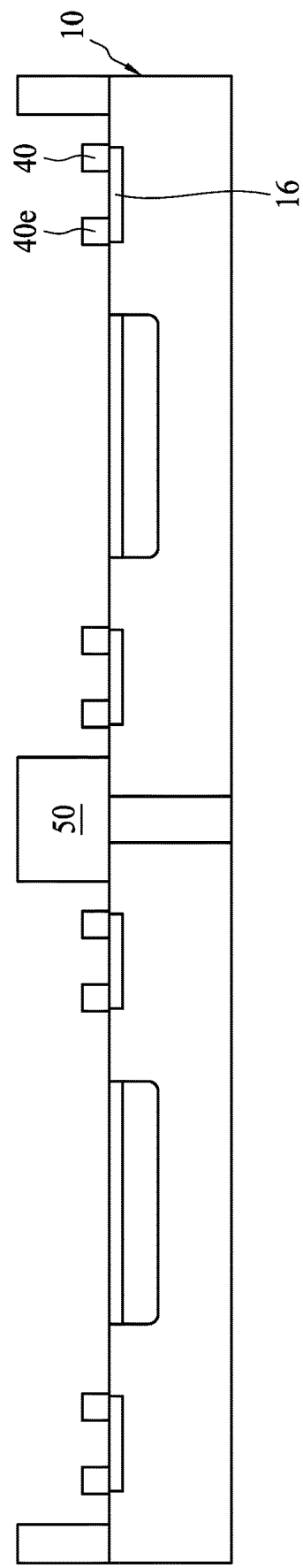

Referring to FIG. 4B, the adhesive layer 50 is formed on the semiconductor device 10. The adhesive layer 50 may be formed by, for example but is not limited to, dispensing, printing, lamination or other suitable technique(s). In some other embodiments (not illustrated), the adhesive layer 50 may be applied over the semiconductor device 10 after disposing the substrate 20e over each of the device regions 401, 402.

Figure 4C:
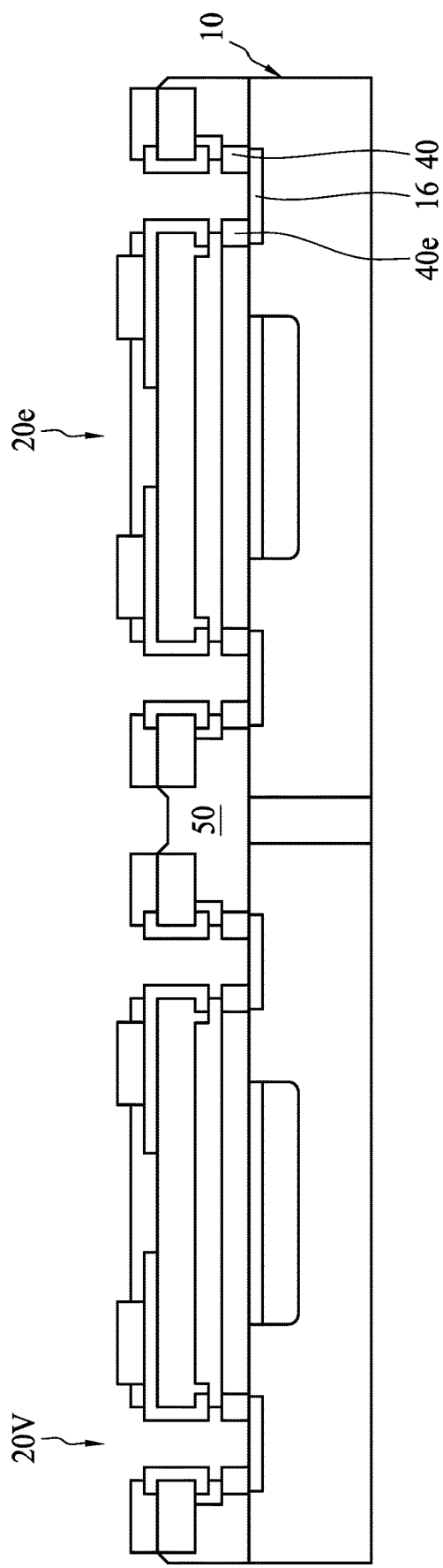

Referring to FIG. 4C, a plurality of substrates 20e is provided. The plurality of substrates 20e can be referred to a patterned substrate herein since at least a through hole 20V is formed in the substrate 20. The substrates 20e may be individually provided over each of the device regions 401, 402. In some embodiments, each of the plurality of substrates 20e is bonded to the semiconductor device 10 by aligning the through hole 20V and the patterned conductive layer 16 on the semiconductor device 10. That is, after bonding the substrate 20e with the semiconductor device 10 via the adhesive layer 50, the patterned conductive layer 16 is exposed from the through via 20V of the substrate 20e.

Figure 4D:
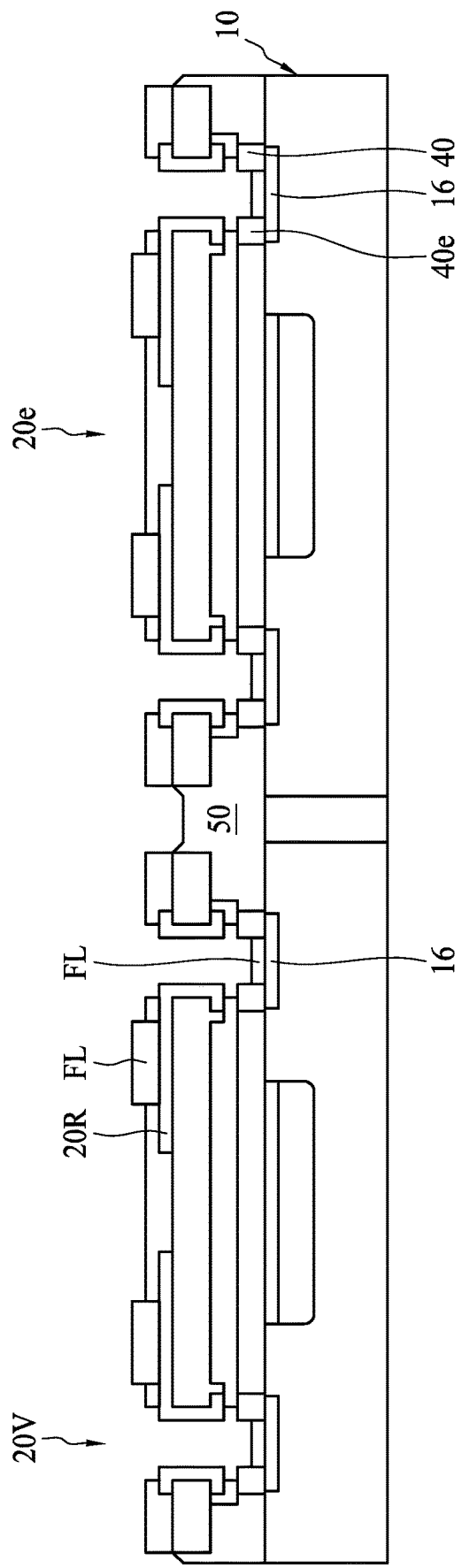

Referring to FIG. 4D, flux FL may be formed on the substrate 20e. The flux FL may be formed on the RDLs 20R exposed from the substrate 20e. The flux FL may be formed on the patterned conductive layer 16 of the semiconductor device 10. The flux FL may be formed/applied on conductive portion(s) to be bonded to connection element(s). The flux FL may be formed with the help of a patterned stencil. The flux FL may be formed by, for example but is not limited to, printing, jetting or other suitable technique(s). A clean operation may be performed after a reflow operation when the flux FL is previously formed. The flux thickness could be adjusted by jetting parameters (e.g. speed) when conducting a jetting operation.

Figure 4E:
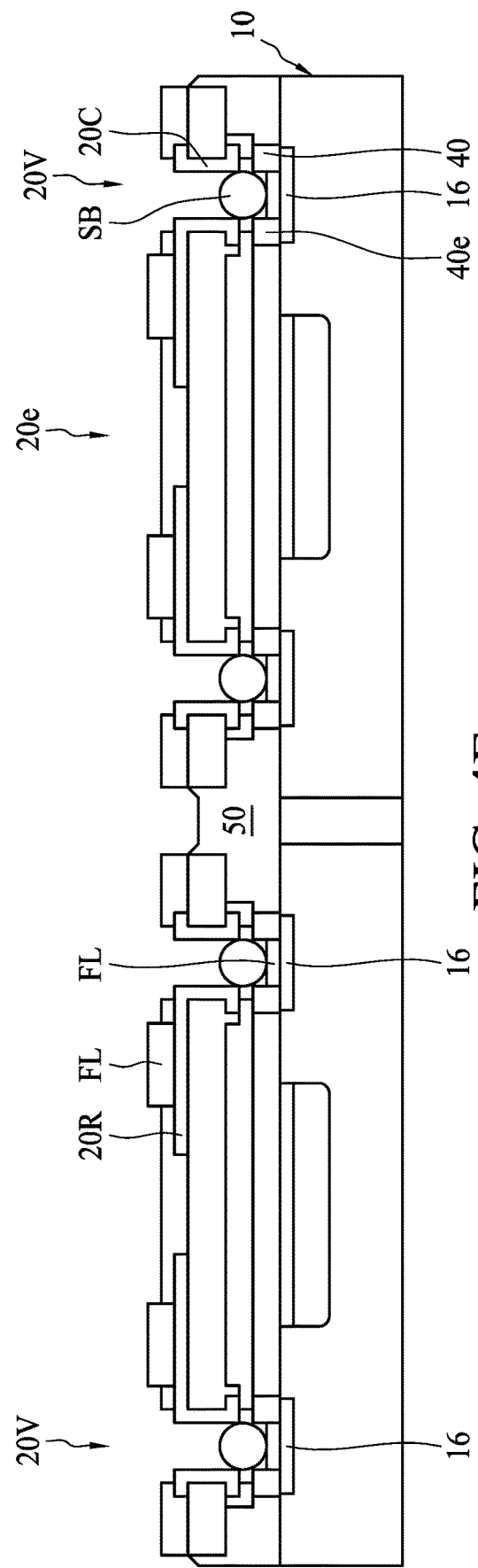

Referring to FIG. 4E, the connection element (e.g. solder material) SB is disposed within the through hole 20V over the flux FL. In some embodiments, the connection element SB may be more than one solder balls. Depending on the aspect ratio of the through hole 20V, number of the solder balls can be adjusted so that after the reflow operation, the connection element SB can be electrically connected with the patterned conductive layer 20C of the substrate 20e and the patterned conductive layer 16 of the semiconductor device 10. The connection elements SB may be formed with the help of a patterned stencil. A plate or brush may facilitate disposing the connection elements SB onto the patterned conductive layer 16.

Figure 4F:
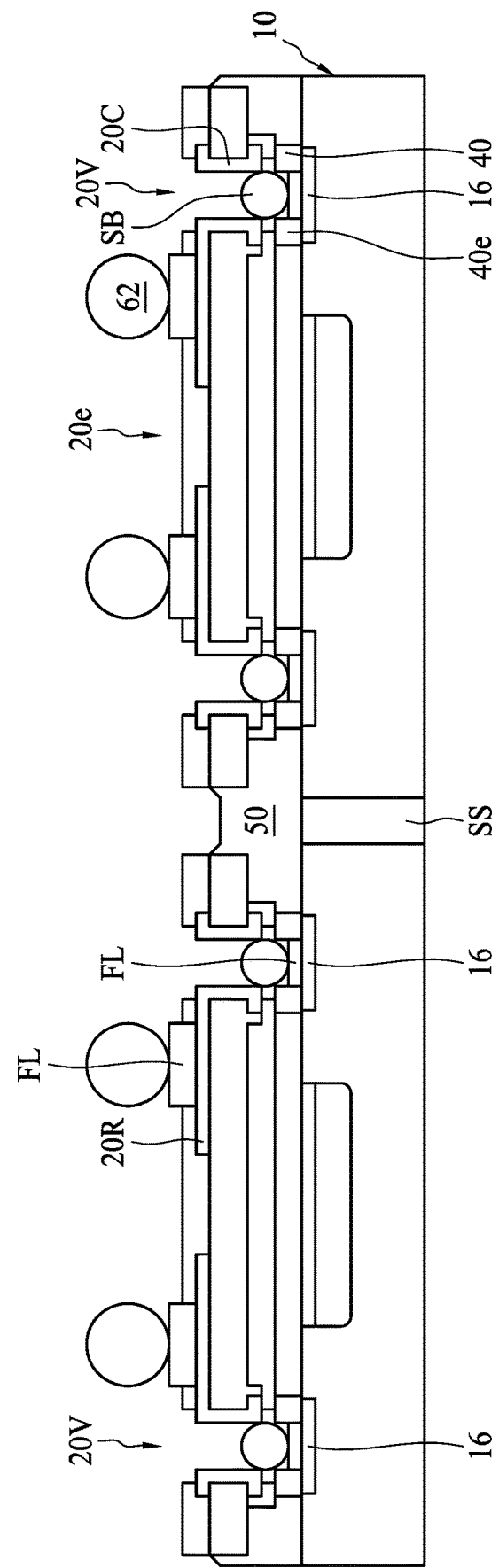

Referring to FIG. 4F, connection elements (e.g. solder balls) 62 are further disposed on the RDL 20R of the substrate 20e. Connection elements 62 may be a solder ball having a size different from the connection element SB.

Figure 4G:
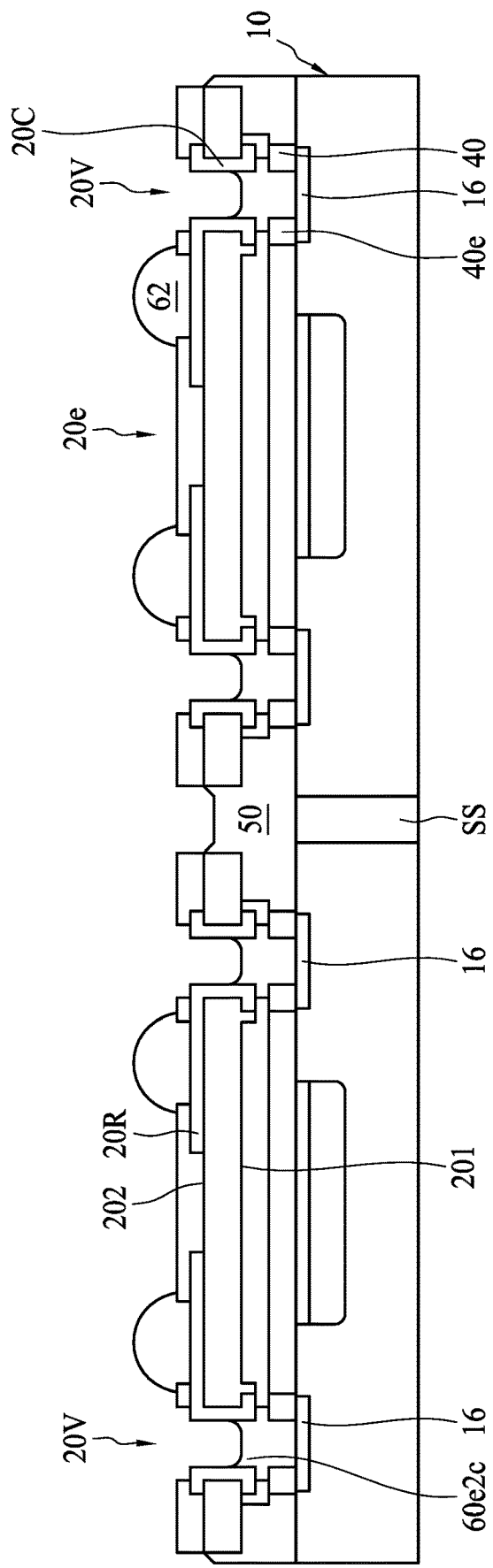

Referring to FIG. 4G, a reflow operation is performed. The connection elements SB are melted to fill at least a lower portion of the through via 20V. The connection elements SB are melted to form electrical connection with the patterned conductive layers 16. The connection elements SB are melted to form electrical connection with the patterned conductive layer 20C of the substrate 20e. The connection elements SB are melted to bond form electrical connection between the substrate 20e and the semiconductor device 10. Due to the cohesion force of the solder material, connection elements SB may show a curved surface 60e2c after the reflow operation. In addition, a top surface of the curved surface 60e2c may be situated between the top surface 202 and the bottom surface 201 of the substrate 20e, depending on the number of solder ball SB originally disposed.

Subsequent to FIG. 4G, a singulation operation may be performed along a boundary of adjacent device regions 401, 402, to produce a semiconductor device package similar or same as the semiconductor device package 1e in FIG. 1E.

Figure 5A:
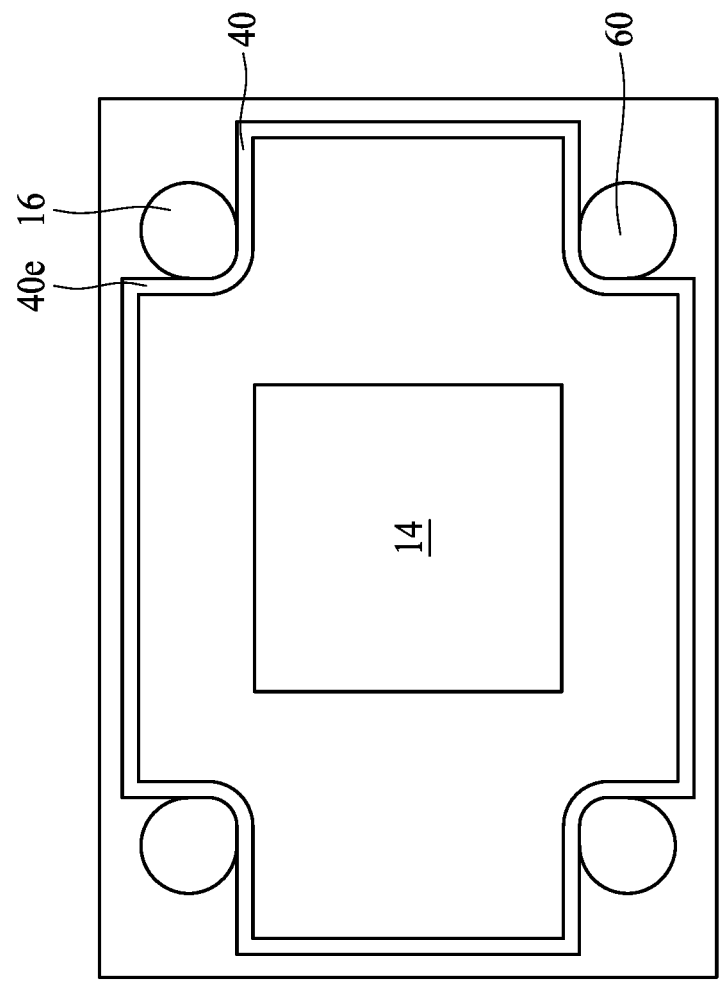
FIG. 5A shows a top view of a patterned insulation layer in accordance with some other embodiments of the subject application.

FIG. 5A shows a top view of a patterned insulation layer 40 in accordance with some embodiments of the subject application. As shown in FIG. 5A, the patterned insulation layer 40 further includes a portion 40e between the patterned conductive layer 16 and the MEMS component such as a membrane 14 of the semiconductor device 10. A portion of the periphery of the patterned conductive layer 16 is not surrounded by the insulation layer 40. Said portion of the periphery is facing away from the MEMS component such as a membrane 14 of the semiconductor device 10.

Figure 5B:
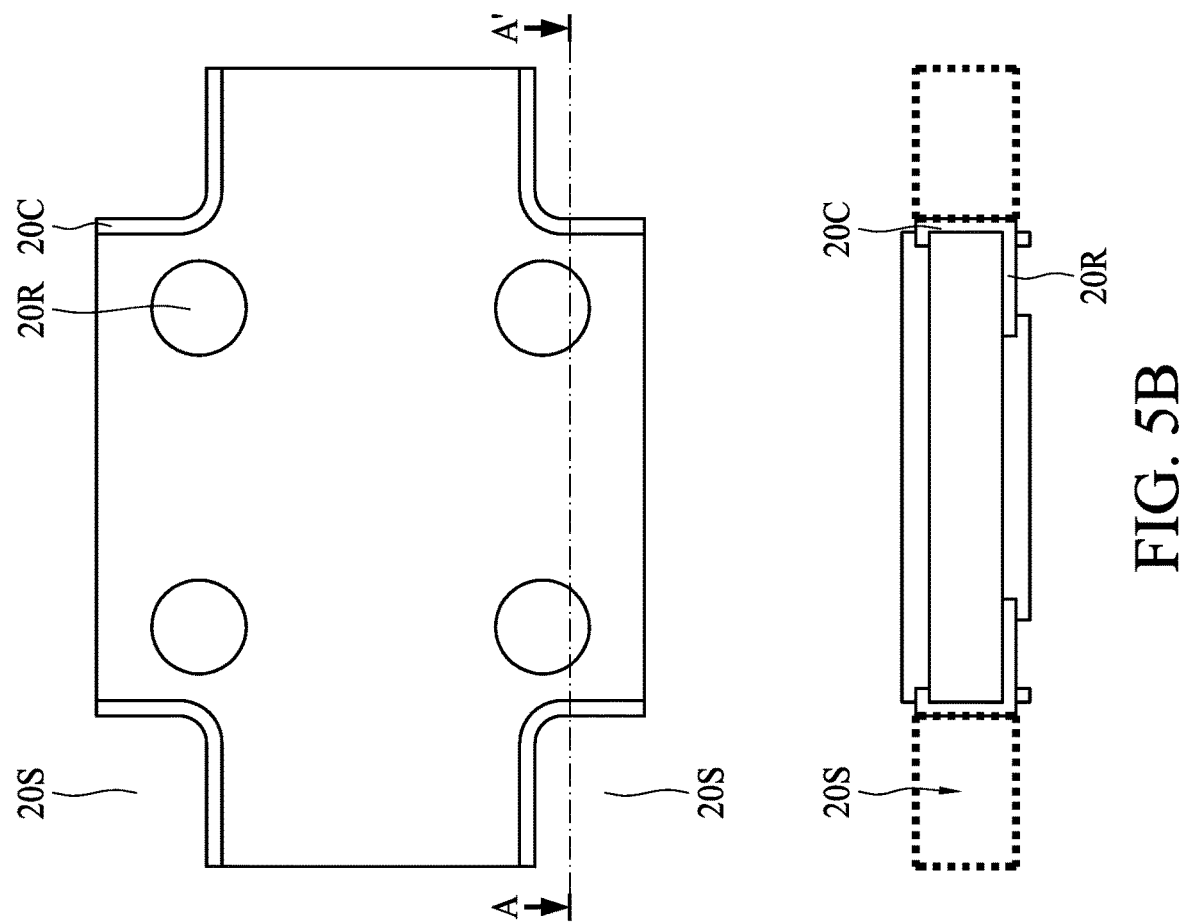
FIG. 5B shows a top view and a cross-sectional view of a substrate in accordance with some embodiments of the subject application.

FIG. 5B shows a substrate 20f in accordance with some other embodiments of the subject application. The upper portion of FIG. 5B illustrates a top view of the substrate 20f. The bottom portion of FIG. 5B illustrates a cross-sectional view across line AA' in the upper portion of FIG. 5B. As shown in the upper portion of FIG. 5B, a stamped hole 20S, or an open hole, is formed in the substrate 20f, instead of a through hole 20V as previously appeared in substrates 20, 20b, 20e. Patterned conductive layer 20C of the substrate 20f is lined at a sidewall of the stamped hole 20S, and from an open "C" shape from a planar perspective. In some embodiments, RDL 20R may be formed in the substrate 20f, electrically connected to the patterned conductive layer 20C, and exposed at a top surface of the substrate 20f. As shown in the bottom portion of FIG. 5B, patterned conductive layer 20C is lined at a sidewall of the stamped hole 20S, and it appears to be lined at a sidewall of the substrate 20f from a cross-sectional perspective.

Manufacturing operation of the semiconductor device package if can be similar to those described in FIG. 4A to FIG. 4G except that the substrate is changed from the one with through holes 20V to the one with stamped hole 20S, as illustrated in FIG. 5B. In such connection, rather than having a curved top surface 60e2c as shown in FIG. 4G, connection elements 60f disposed on the patterned conductive layer 16 in each device regions of the semiconductor device 10 of semiconductor device package if demonstrate an inclined surface 60f2 connecting the patterned conductive layer 20Cf and the patterned conductive layer 16.

Figure 6:
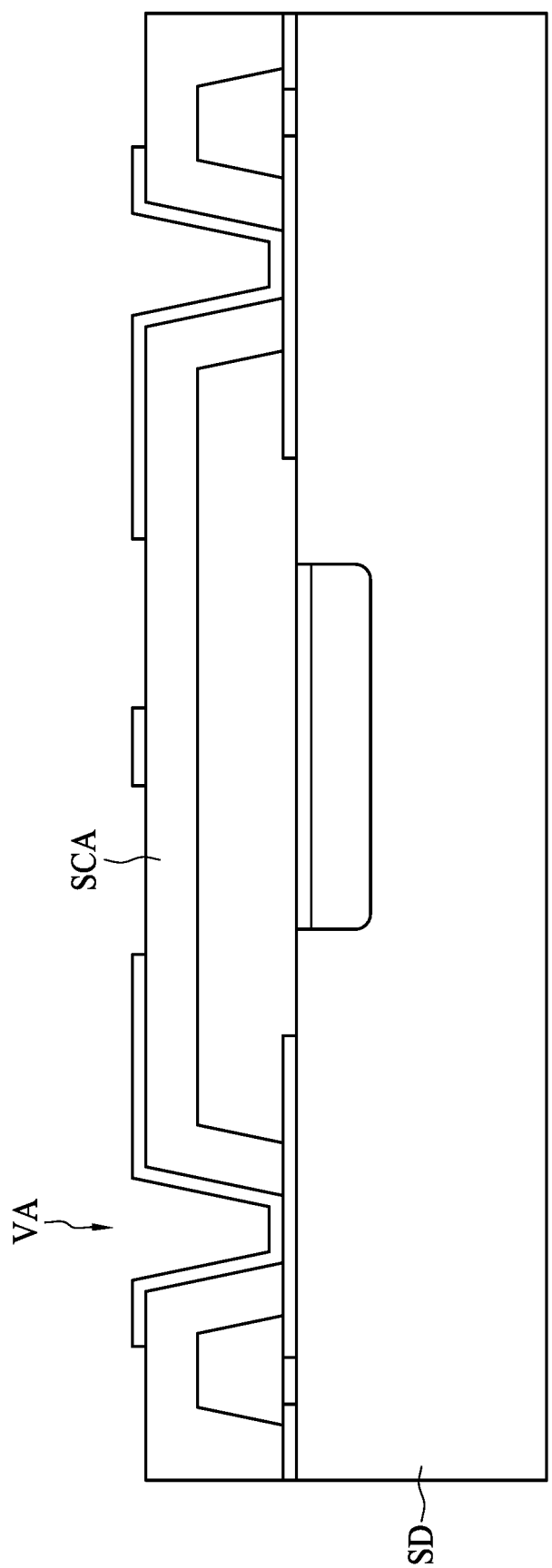
FIG. 6 shows a semiconductor device package with silicon caps disposed on semiconductor devices, in accordance with some comparative embodiments of the subject application.

FIG. 6 shows a semiconductor device package of a comparative example of the subject application. A semiconductor capping substrate SCA is disposed on a semiconductor device similar to the semiconductor device 10 in the embodiments of present disclosure. The semiconductor capping substrate SCA is electrically connected with the semiconductor device SD through the through silicon vias (TSV) VA machined in the semiconductor capping substrate SCA. One or more conductive layer is further lined in the TSV. Cost of manufacturing the TSV is higher compared to the connection elements described in the present disclosure.

As used herein, the terms "substantially," "approximately" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two surfaces can be deemed to be coplanar or substantially coplanar if a displacement between the two surfaces is no greater than 5 μm, no greater than 2 μm, no greater than 1 μm, or no greater than 0.5 μm.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not necessarily be drawn to scale.

There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor device package, comprising:
   a semiconductor device;
   a non-semiconductor substrate over the semiconductor device; and
   a first connection element extending from the semiconductor device to the non-semiconductor substrate and electrically connecting the semiconductor device to the non-semiconductor substrate,
   wherein the semiconductor device further comprises a first patterned conductive layer on a surface of the semiconductor device facing the non-semiconductor substrate, the non-semiconductor substrate further comprises a second patterned conductive layer on a sidewall of the non-semiconductor substrate, and the first connection element electrically connects the first patterned conductive layer to the second patterned conductive layer, and
   wherein the semiconductor device package further comprises a patterned insulation layer between the semiconductor device and the non-semiconductor substrate, wherein the patterned insulation layer surrounds the first patterned conductive layer and the first connection element has a surface inclined with respect to the surface of the semiconductor device and extending from the second patterned conductive layer to the patterned insulation layer.

2. The semiconductor device package of claim 1, wherein the non-semiconductor substrate comprises a through hole, the first connection element extending from the semiconductor device into the through hole.

3. The semiconductor device package of claim 2, further comprising a second connection element in the through hole of the non-semiconductor substrate and surrounded by the first connection element.

4. The semiconductor device package of claim 1, wherein the first connection element at least partially fills the through hole thereby forming a space between the semiconductor device, the patterned insulation layer, and the non-semiconductor substrate.

5. The semiconductor device package of claim 1, wherein the first connection element comprises solder material.

6. The semiconductor device package of claim 1, wherein the non-semiconductor substrate further comprises a patterned conductive layer on a surface away from the semiconductor device.

7. The semiconductor device package of claim 1, wherein the non-semiconductor substrate is narrower than the semiconductor device.

8. The semiconductor device package of claim 1, wherein the semiconductor device comprises a membrane, and the patterned insulation layer surrounds the membrane.

9. The semiconductor device package of claim 1, further comprising an adhesive layer connecting the non-semiconductor substrate and the semiconductor device.

10. The semiconductor device package of claim 9, wherein a top surface of the adhesive layer is lower than a top surface of the non-semiconductor substrate.

11. The semiconductor device package of claim 1, wherein the first connection element protrudes from a surface of the non-semiconductor substrate.

12. The semiconductor device package of claim 1, wherein the first connection element comprises a top surface lower than a top surface of the non-semiconductor substrate.

13. The semiconductor device package of claim 12, wherein the top surface of the first connection element comprises a slope.

14. The semiconductor device package of claim 12, wherein the top surface of the first connection element is concave.

15. The semiconductor device package of claim 1, wherein the patterned insulation layer surrounds the first connection element.

16. The semiconductor device package of claim 1, wherein the semiconductor device comprises a membrane and the patterned insulation layer separates the first connection element from the membrane.

* * * * *